United States Patent
Zahuranec et al.

(10) Patent No.: US 8,450,597 B2
(45) Date of Patent: May 28, 2013

(54) LIGHT BEAM PATTERN AND PHOTOVOLTAIC ELEMENTS LAYOUT

(75) Inventors: Terry L. Zahuranec, North Olmsted, OH (US); Neil D. Sater, Brecksville, OH (US); Bernard L. Sater, Strongsville, OH (US)

(73) Assignee: MH Solar Co., Ltd., Taipei (TW)

( * ) Notice: Subject to any disclaimer, the term of this patent is extended or adjusted under 35 U.S.C. 154(b) by 223 days.

(21) Appl. No.: 12/496,541

(22) Filed: Jul. 1, 2009

(65) Prior Publication Data

US 2010/0006139 A1 Jan. 14, 2010

Related U.S. Application Data

(60) Provisional application No. 61/078,259, filed on Jul. 3, 2008.

(51) Int. Cl.
H01L 31/042 (2006.01)
(52) U.S. Cl.
USPC .......................................................... 136/246
(58) Field of Classification Search
USPC .......................................................... 136/246
See application file for complete search history.

(56) References Cited

U.S. PATENT DOCUMENTS

| | | | |
|---|---|---|---|
| 3,696,286 A * | 10/1972 | Ule | 320/101 |
| 3,797,476 A | 3/1974 | Tarcici | |
| 3,985,579 A | 10/1976 | Rahilly | |
| 4,041,307 A | 8/1977 | Napoli et al. | |
| 4,090,070 A | 5/1978 | Colomes | |
| 4,098,264 A | 7/1978 | Brokaw | |
| 4,154,219 A | 5/1979 | Gupta et al. | |
| 4,178,913 A | 12/1979 | Hutchison | |
| 4,202,321 A | 5/1980 | Volna | |

(Continued)

FOREIGN PATENT DOCUMENTS

| CA | 1 132 869 | 10/1982 |
|---|---|---|
| CN | 101093114 A | 12/2007 |

(Continued)

OTHER PUBLICATIONS

Sater, et al. High Voltage Silicon VMJ Solar Cells for up to 1000 Suns Intensities. Photovoltaic Specialists Conference 2002. Conference Record of the Twenty-Ninth IEEE, May 19-24, 2002, pp. 1019-1022. Last accessed Oct. 1, 2009, 4 pages. http:ieeexplore.ieee.orgXploredefdeny.jsp?url=http%3A%2F%2Fieeexplore.ieee.org%2Fstamp%2Fstamp.jsp%3Ftp%.

(Continued)

Primary Examiner — Miriam Berdichevsky
(74) Attorney, Agent, or Firm — Turocy & Watson, LLP

(57) ABSTRACT

System(s) and method(s) are provided for assembling and utilizing parabolic reflectors in a solar concentrator. Parabolic reflectors assembly starts with a low-cost, flat reflective material that is bent into a parabolic or trough shape via a set of support ribs that are affixed in a support beam. The parabolic reflectors are mounted on a support frame in various panels or arrays to form a parabolic solar concentrator. Each parabolic reflector focuses light in a line segment pattern. Light beam pattern focused onto a receiver via the parabolic solar concentrator can be optimized. The receiver is attached to the support frame, opposite the parabolic reflector arrays, and includes a photovoltaic (PV) module and a heat harvesting element that enable dual-mode energy conversion operation. To increase performance of the parabolic solar concentrator, the PV module can be configured to advantageously exploit a light beam pattern optimization regardless irregularities in the pattern.

18 Claims, 26 Drawing Sheets

U.S. PATENT DOCUMENTS

| | | | |
|---|---|---|---|
| 4,219,729 A | 8/1980 | Smith | |
| 4,223,214 A | 9/1980 | Dorian et al. | |
| 4,248,643 A | 2/1981 | Peters | |
| 4,249,514 A * | 2/1981 | Jones | 126/605 |
| 4,262,195 A | 4/1981 | White et al. | |
| 4,296,731 A * | 10/1981 | Cluff | 126/578 |
| 4,315,163 A | 2/1982 | Bienville | |
| 4,328,789 A | 5/1982 | Nelson | |
| 4,354,484 A | 10/1982 | Malone et al. | |
| 4,364,183 A | 12/1982 | Rhodes | |
| 4,392,008 A | 7/1983 | Cullis | |
| 4,409,422 A | 10/1983 | Sater | |
| 4,445,030 A | 4/1984 | Carlton | |
| 4,496,787 A | 1/1985 | Touchais et al. | |
| 4,501,469 A | 2/1985 | Merges et al. | |
| 4,516,314 A | 5/1985 | Sater | |
| 4,546,756 A | 10/1985 | Leroy et al. | |
| 4,583,520 A | 4/1986 | Dietrich et al. | |
| 4,656,996 A | 4/1987 | Aharon | |
| 4,691,106 A | 9/1987 | Hyun et al. | |
| 4,720,170 A | 1/1988 | Learn, Jr. | |
| 4,771,764 A | 9/1988 | Cluff | |
| 4,836,672 A | 6/1989 | Naiman et al. | |
| 5,022,929 A | 6/1991 | Gallois-Montbrun | |
| 5,125,743 A | 6/1992 | Rust et al. | |
| 5,187,361 A | 2/1993 | Ishii | |
| 5,223,043 A | 6/1993 | Olson et al. | |
| 5,293,447 A | 3/1994 | Fanney | |
| 5,374,939 A | 12/1994 | Pullen V | |
| 5,473,166 A | 12/1995 | Imai et al. | |
| 5,522,944 A | 6/1996 | Elazari | |
| 5,600,124 A | 2/1997 | Berger | |
| 5,616,913 A | 4/1997 | Litterst | |
| 5,707,458 A | 1/1998 | Nagashima et al. | |
| 5,758,938 A | 6/1998 | Osterwisch | |
| 5,798,517 A | 8/1998 | Berger | |
| 5,862,799 A | 1/1999 | Yogev et al. | |
| 5,899,071 A | 5/1999 | Stone et al. | |
| 5,964,216 A | 10/1999 | Hoffschmidt et al. | |
| 5,982,481 A | 11/1999 | Stone et al. | |
| 6,018,122 A | 1/2000 | Hibino et al. | |
| 6,018,123 A | 1/2000 | Takada | |
| 6,080,927 A | 6/2000 | Johnson | |
| 6,123,067 A | 9/2000 | Warrick | |
| 6,127,620 A | 10/2000 | Tange et al. | |
| 6,281,426 B1 * | 8/2001 | Olson et al. | 136/249 |
| 6,284,968 B1 | 9/2001 | Niesyn | |
| 6,485,152 B2 | 11/2002 | Wood | |
| 6,597,709 B1 | 7/2003 | Diver, Jr. | |
| 6,662,801 B2 | 12/2003 | Hayden | |
| 6,704,607 B2 | 3/2004 | Stone et al. | |
| 6,848,442 B2 | 2/2005 | Haber | |
| 6,936,760 B2 | 8/2005 | Rogers et al. | |
| 6,984,050 B2 | 1/2006 | Nakamura | |
| 7,076,965 B2 | 7/2006 | Lasich | |
| 7,079,317 B2 | 7/2006 | Baun et al. | |
| 7,092,156 B2 | 8/2006 | Baun et al. | |
| 7,109,461 B2 | 9/2006 | Lasich | |
| 7,185,845 B1 | 3/2007 | Hartman et al. | |
| 7,197,829 B2 | 4/2007 | Acres | |
| 7,228,661 B2 | 6/2007 | Rizzotto | |
| 7,253,902 B2 | 8/2007 | Feldman | |
| 7,357,132 B2 | 4/2008 | Hayden | |
| 7,709,730 B2 | 5/2010 | Johnson et al. | |
| 7,825,327 B2 | 11/2010 | Johnson et al. | |
| 7,834,303 B2 | 11/2010 | Fatehi et al. | |
| 7,873,490 B2 | 1/2011 | MacDonald | |
| 8,229,581 B2 | 7/2012 | Zalusky et al. | |
| 2002/0179138 A1 * | 12/2002 | Lawheed | 136/246 |
| 2003/0045949 A1 | 3/2003 | Stone et al. | |
| 2004/0163697 A1 | 8/2004 | Papadopoulos | |
| 2004/0216777 A1 | 11/2004 | Pan | |
| 2005/0016581 A1 | 1/2005 | Fujisaki et al. | |
| 2005/0109387 A1 * | 5/2005 | Marshall | 136/253 |
| 2007/0034205 A1 | 2/2007 | Watts | |
| 2007/0089775 A1 * | 4/2007 | Lasich | 136/246 |
| 2007/0095341 A1 | 5/2007 | Kaneff | |
| 2007/0145252 A1 | 6/2007 | Litchfield et al. | |
| 2007/0150198 A1 | 6/2007 | MacDonald | |
| 2007/0151245 A1 | 7/2007 | Coffey et al. | |
| 2007/0215198 A1 | 9/2007 | Jiang et al. | |
| 2007/0227574 A1 | 10/2007 | Cart | |
| 2007/0240705 A1 | 10/2007 | Papadopoulos | |
| 2007/0251564 A1 | 11/2007 | Smith | |
| 2007/0251569 A1 | 11/2007 | Shan et al. | |
| 2008/0011288 A1 | 1/2008 | Olsson | |
| 2008/0017784 A1 | 1/2008 | Hoot et al. | |
| 2008/0040990 A1 | 2/2008 | Vendig et al. | |
| 2008/0087318 A1 | 4/2008 | Jwo | |
| 2008/0128559 A1 | 6/2008 | Ho et al. | |
| 2009/0056699 A1 | 3/2009 | Mills et al. | |
| 2009/0114211 A1 | 5/2009 | Homyk et al. | |
| 2009/0126774 A1 | 5/2009 | Taylor et al. | |
| 2009/0205637 A1 | 8/2009 | Moore et al. | |
| 2009/0293861 A1 | 12/2009 | Taylor et al. | |
| 2010/0000519 A1 | 1/2010 | Zalusky et al. | |
| 2010/0000522 A1 | 1/2010 | Zahuranec | |
| 2010/0006139 A1 | 1/2010 | Zahuranec et al. | |
| 2010/0263659 A9 | 10/2010 | Taylor et al. | |
| 2011/0048403 A1 | 3/2011 | Stavrou et al. | |

FOREIGN PATENT DOCUMENTS

| | | | | |
|---|---|---|---|---|
| EP | 1919029 | | 5/2008 | |
| ES | 2114826 A1 | | 6/1998 | |
| GB | 2 426 324 A | | 11/2006 | |
| JP | 62 166 110 | | 7/1987 | |
| JP | 63096447 | | 4/1988 | |
| JP | 7038131 A | | 2/1995 | |
| JP | 8 130 322 | | 5/1996 | |
| JP | 2001053322 A | * | 2/2001 | 136/243 |
| JP | 2004-312054 A | | 11/2004 | |
| JP | 2005018352 A | | 1/2005 | |
| JP | 2005 038 270 | | 2/2005 | |
| KR | 100343263 B1 | | 6/2002 | |
| WO | 2008003023 | | 1/2008 | |
| WO | 2008013976 A2 | | 1/2008 | |
| WO | 2008117297 | | 10/2008 | |

OTHER PUBLICATIONS

Building Integrated, Infrastructure, and Utility Scale Solar Power. http://www.power-spar.com/Power-Spar/index.phpwww.powerspar.com. Last accessed Aug. 14, 2009, 1 page.

OA dated Apr. 28, 2011 for U.S. Appl. No. 12/495,164, 33 pages.

Written Opinion and International Search Report mailed Nov. 10, 2009 for PCT Application No. PCT/US 09/49610, 25 pages.

OA dated Dec. 22, 2011 for U.S. Appl. No. 12/496,034, 35 pages.

OA dated Nov. 21, 2011 for U.S. Appl. No. 12/495,398, 30 pages.

OA dated Nov. 14, 2011 for U.S. Appl. No. 12/496,150, 36 pages.

OA mailed Oct. 17, 2011 for U.S. Appl. No. 12/495,164, 16 pages.

The Fredericks Company. "Electrolytic Tilt Sensor Selection and Operation" published on the Internet at [http://www.frederickscom.com/sens_tech_select.tpl], retrieved Oct. 8, 2011, 3 pages.

The Fredericks Company. "TrueTILT Wide Range" published on the Internet at [http://www.frederickscom/com/sens_tilt_0717_4304.tpl], retrieved Oct. 8, 2011, 1 page.

The Fredericks Company, "0717-4304-99 TrueTilt, Dual Axis, Wide Angle, Electrolytic Tilt Sensor" published on the Internet at [http://www.frederickscom.com/pdf/0717-4304.pdf], retrieved Oct. 8, 2011, 2 pages.

Australian Office Action mailed Oct. 18, 2011 for AU Application No. 2009266870, 3 pages.

Notice of allowance dated Mar. 23, 2012 for U.S. Appl. No. 12/495,164, 36 pages.

Final Office Action dated Apr. 16, 2012 for U.S. Appl. No. 12/495,398, 36 pages.

Non-Final Office Action dated Mar. 30, 2012 for U.S. Appl. No. 12/495,136, 41 pages.

OA dated Aug. 31, 2012 for U.S. Appl. No. 12/495,136, 13 pages.

OA dated Jun. 22, 2012 for U.S. Appl. No. 12/496,150, 38 pages.

OA dated Jun. 28, 2012 for U.S. Appl. No. 12/495,303, 70 pages.

OA dated Sep. 25, 2012 for U.S. Appl. No. 12/495,398, 22 pages.

OA dated Jan. 25, 2013 for U.S. Appl. No. 12/495,398, 16 pages.

English Translation of Mexican OA mailed Dec. 27, 2012 for Mexican Patent Application No. MX/a/2011/000201, 3 pages.

* cited by examiner

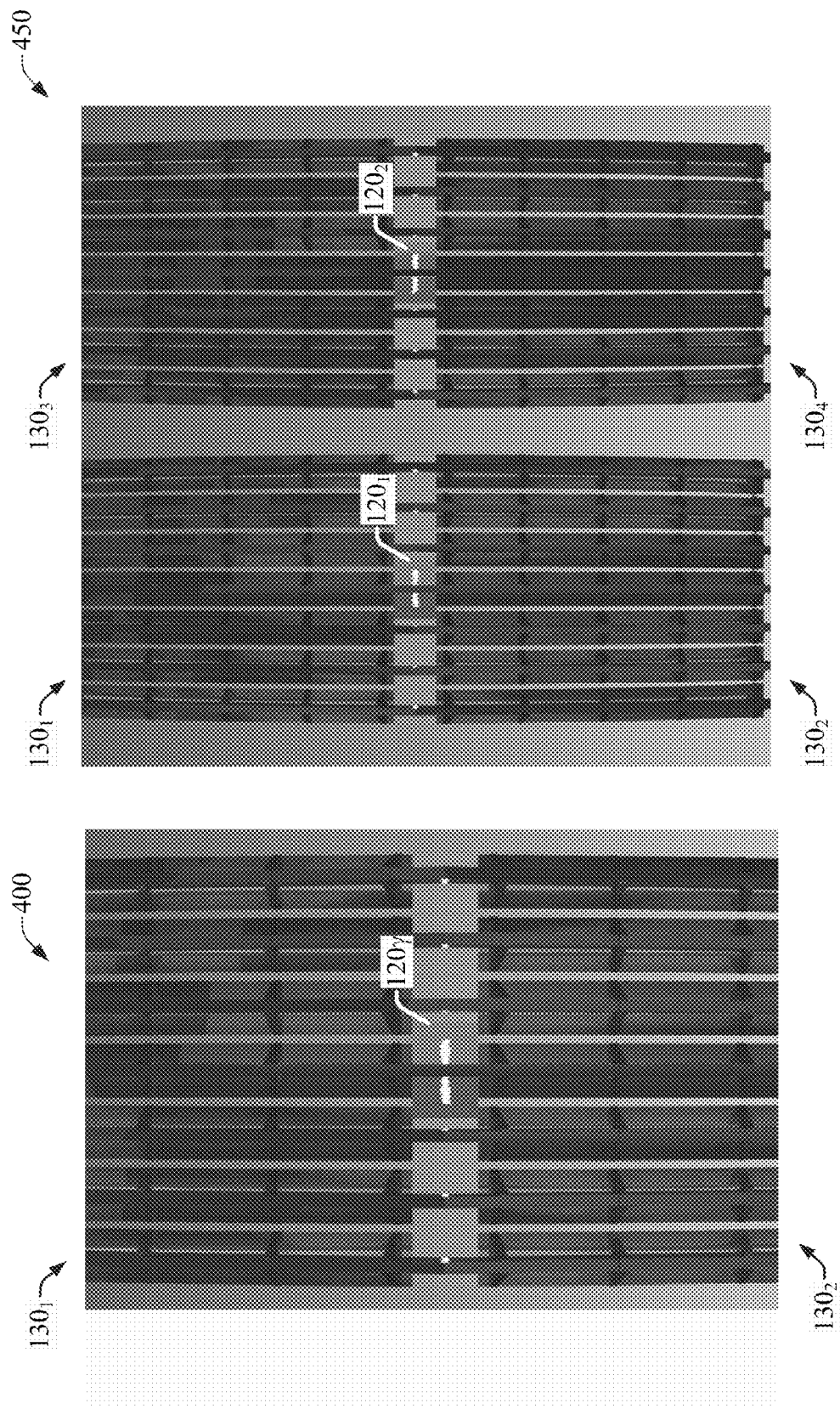

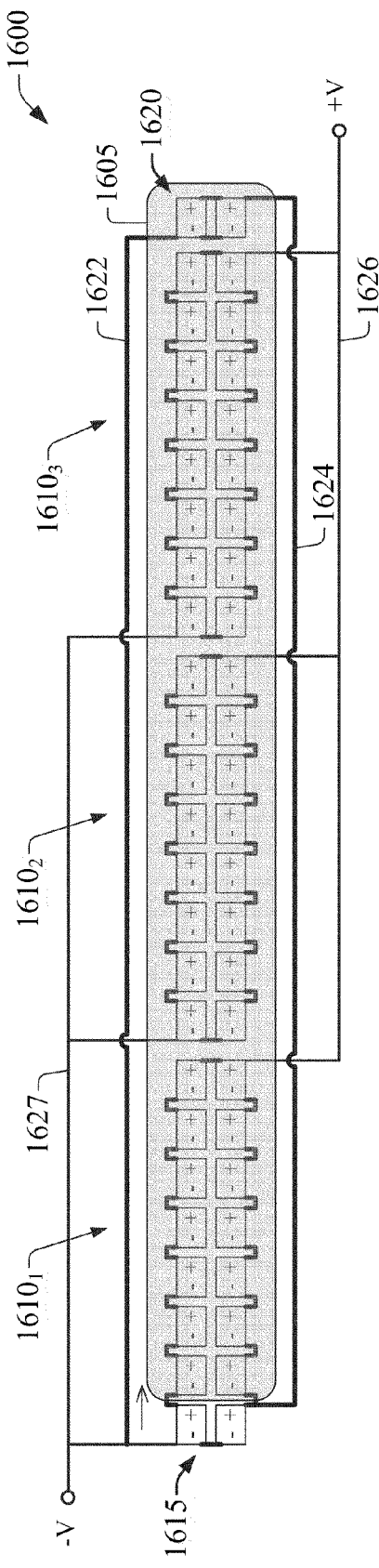
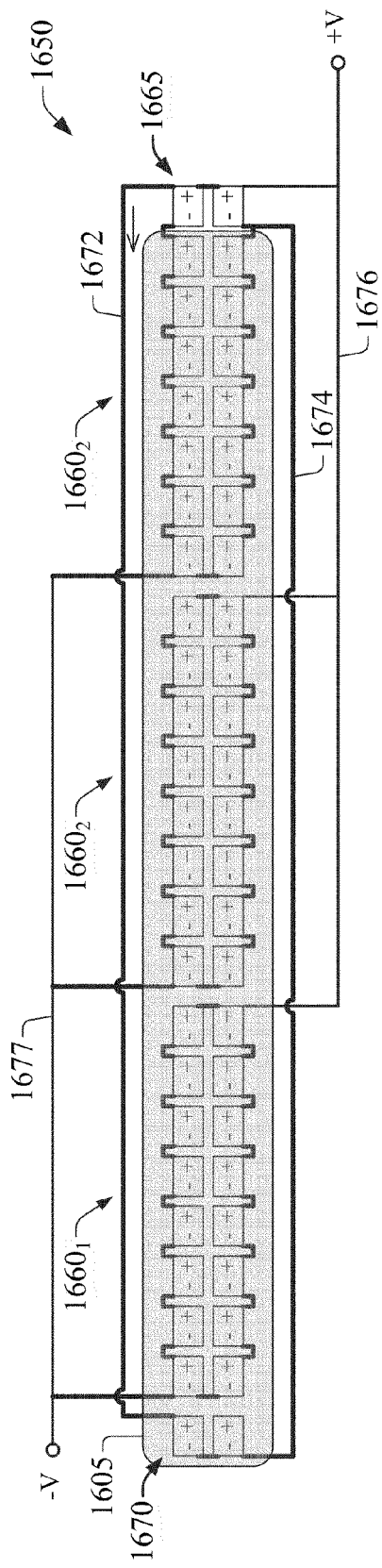
FIG. 16A
FIG. 16B

LIGHT BEAM PATTERN AND PHOTOVOLTAIC ELEMENTS LAYOUT

CROSS-REFERENCE TO RELATED APPLICATIONS

This application claims the benefit of U.S. Provisional Application Ser. No. 61/078,259 filed Jul. 3, 2008, entitled "LIGHT BEAM PATTERN AND PHOTOVOLTAIC ELEMENTS LAYOUT," the entirety of which is incorporated herein by reference.

BACKGROUND

Limited supply and increasing demand of fossil energy resources and associated global environmental damage have driven global efforts to diversify utilization energy resources and related technologies. One such resource is solar energy, which employs photovoltaic (PV) technology for conversion of light into electricity. In addition, solar energy can be exploited for heat generation (e.g., in solar furnaces, steam generators, and the like). Solar technology is typically implemented in a series of PV cells, or solar cells, or panels thereof that receive sunlight and convert the sunlight into electricity, which can be subsequently delivered into a power grid. Significant progress has been achieved in design and production of solar panels, which has effectively increased efficiency while reducing manufacturing cost thereof. As more highly efficient solar cells are developed, size of the cell is decreasing leading to an increase in the practicality of employing solar panels to provide a competitive renewable energy substitute to dwindling and highly demanded non-renewable sources. To this end, solar energy collection systems like solar concentrators can be deployed to convert solar energy into electricity which can be delivered to power grids, and to harvest heat as well.

Parabolic reflectors are typically utilized to achieve light concentration. To produce electricity or heat, parabolic reflectors typically focus light into a focal area, or locus, which can be localized (e.g., a focal point) or extended (e.g., a focal line). Most reflector designs, however, posses substantial structural complexity that hinders mass producibility and ease of assembly of the design into a solar collector for energy conversion. Moreover, structural complexity generally complicates alignment of reflective elements (e.g., mirrors) as well as installation and maintenance or service of deployed concentrators.

SUMMARY

The following presents a simplified summary in order to provide a basic understanding of some aspects described herein. This summary is not an extensive overview nor is intended to identify key/critical elements or to delineate the scope of the various aspects described herein. Its sole purpose is to present some concepts in a simplified form as a prelude to the more detailed description that is presented later.

The subject innovation provides system(s) and method(s) for assembling and utilizing low-cost, mass producible parabolic reflectors in a solar concentrator for energy conversion. Parabolic reflectors can be assembled by starting with a flat reflective material that is bent into a parabolic or trough shape via a set of support ribs that are affixed in a support beam. The parabolic reflectors are mounted on a support frame in various panels or arrays to form a parabolic solar concentrator. Each parabolic reflector focuses light in a line segment pattern. Light beam pattern focused onto a receiver via the parabolic solar concentrator can be optimized to attain a predetermined performance. The receiver is attached to the support frame, opposite the parabolic reflector arrays, and includes a photovoltaic (PV) module and a heat harvesting element or component. To increase or retain a desired performance of the parabolic solar concentrator, the PV module can be configured, through adequate arrangement of PV cells that are monolithic, for example, and exhibit a preferential orientation, to advantageously exploit a light beam pattern optimization regardless of irregularities in the pattern.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

BRIEF DESCRIPTION OF THE DRAWINGS

FIGS. 4A-4B illustrate, respectively, an example single-receiver configuration and an example double-receiver arrangement in accordance with aspects described herein.

FIG. 16A-16B illustrate two example cluster configurations of PV cells that enable passive correction of changes of focused beam light pattern in accordance with aspects described herein.

DETAILED DESCRIPTION

Figure 1A:
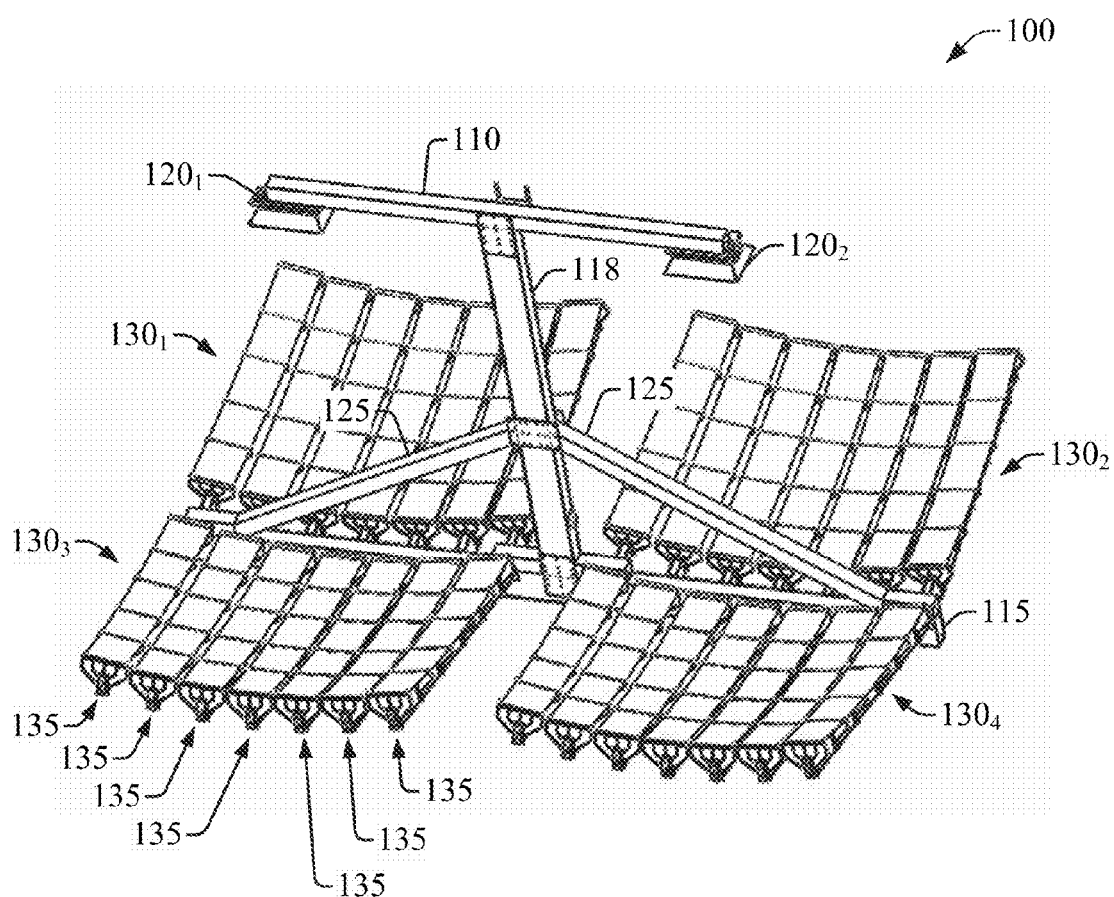
FIGS. 1A and 1B illustrate, respectively, a diagram of an example parabolic solar concentrator and a focused light beam in accordance with aspects disclosed in the subject application.

The subject innovation is now described with reference to the drawings, wherein like reference numerals are used to refer to like elements throughout. In the following description, for purposes of explanation, numerous specific details are set forth in order to provide a thorough understanding of the present innovation. It may be evident, however, that the present innovation can be practiced without these specific details. In other instances, well-known structures and devices are shown in block diagram form in order to facilitate describing the present invention.

As used in this application, the terms "component," "system," "platform," "layer," "node," "selector," "interface," and the like are intended to refer to a computer-related entity or an entity related to an operational apparatus with one or more specific functionalities, wherein the entity can be either hardware, a combination of hardware and software, software, or software in execution. As an example, a component may be, but is not limited to being, a process running on a processor, a processor, an object, an executable, a thread of execution, a program, and/or a computer. By way of illustration, both an application running on a server or network controller, and the server or network controller can be a component. One or more components may reside within a process and/or thread of execution and a component may be localized on one computer and/or distributed between two or more computers. Also, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software, or firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that confers at least in part the functionality of the electronic components. As further yet another example, interface(s) can include input/output (I/O) components as well as associated processor, application, or Application Programming Interface (API) components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

FIG. 1A illustrates a diagram of an example parabolic solar concentrator 100. The example solar concentrator 100 includes four panels $130_1$-$130_4$ of reflectors 135 that focus a light beam on two receivers $120_1$-$120_2$-panels $130_1$ and $130_3$ focus light on receiver $120_1$, and panels $130_2$ and $130_4$ focus light on receiver $120_2$. Receivers $120_1$ and $120_2$ can both collect sunlight for generation of electricity or electric power; however, in alternative or additional configurations receiver $120_1$ can be utilized for thermal energy harvesting while receiver $120_2$ can be employed for electric power generation. Reflectors 135 are attached (e.g., bolted, welded) to a main support beam 135 which is part of a support structure that includes a mast 118, a beam 130 that supports receivers $120_1$ and $120_2$, and a truss 125 (e.g. a king post truss) that eases the load of panels $130_1$-$130_4$ on main beam 115. Position of truss joints depend on load of panels $130_1$-$130_4$. Supporting structures in example solar concentrator 100 can be made of substantially any material (e.g., metal, carbon fiber) that provides enduring support and integrity to the concentrator. Reflectors 135 can identical or substantially identical; however, in one or more alternative or additional embodiments, reflectors 135 can differ in size. In an aspect, reflectors 135 of different sizes can be employed to generate a focused light beam pattern of collected light with specific characteristics, such a particular level of uniformity.

Reflectors 135 include a reflective element that faces the receivers, and a support structure (described below in connection with FIG. 2). Reflective elements are reliable, inexpensive and readily available flat reflective materials (e.g., mirrors) that are deflected into a parabolic shape, or trough-shaped section, in a longitudinal direction and maintained flat in transversal direction to form a parabolic reflector. Therefore, reflector 135 focuses light on a focal line in a receiver 120. It should be appreciated that even though in example solar concentrator 100 a specific number (7) of reflectors 135 is illustrated, a larger or smaller number of reflectors can be employed in each panel $130_1$-$130_4$. Likewise, any substantial combination of reflector panels, or arrays, 130 and receivers 120 can be utilized in a solar concentrator as described in the subject specification. Such combination can include one or more receivers.

Additionally, it should be appreciated that reflectors 135 can be back coated with a protective element such as plastic foam or the like to facilitate integrity of the element when example solar concentrator 100 adopts a safety or service position (e.g., trough a rotation about main support beam 135) and exposes the back of panel(s) $130_\lambda$, with $\lambda=1, 2, 3, 4$, under severe or adverse whether operation, for example.

It should be further appreciated that example solar collector 100 is a modular structure which can be readily mass produced, and transported piecewise and assembled on a deployment site. Moreover, the modular structure of panels 130 ensure a degree of operational redundancy that facilitated continued sunlight collection even in cases in which one or more reflectors become inoperable (e.g. reflector breaks, misaligns).

In an aspect of the subject innovation, receivers $120_1$-$120_2$ in example concentrator 100 can include a photovoltaic (PV) module that facilitates energy conversion (light to electricity), and it can also harvest thermal energy (e.g., via a serpentine with a circulating fluid that absorbs heat created at the receivers) attached to the support structure of the PV module. It should be appreciated that each of receiver $120_1$ and $120_2$, or substantially any receiver in a solar concentrator as described in the subject specification, can include a PV module without a thermal harvest device, a thermal harvest device without a PV module, or both. Receivers $120_1$-$120_2$ can be electrically interconnected and connected to a power grid or disparate receivers in other solar concentrators. When receivers include a thermal energy harvest system, the system can be connected throughout multiple receivers in disparate solar concentrators.

Figure 1B:
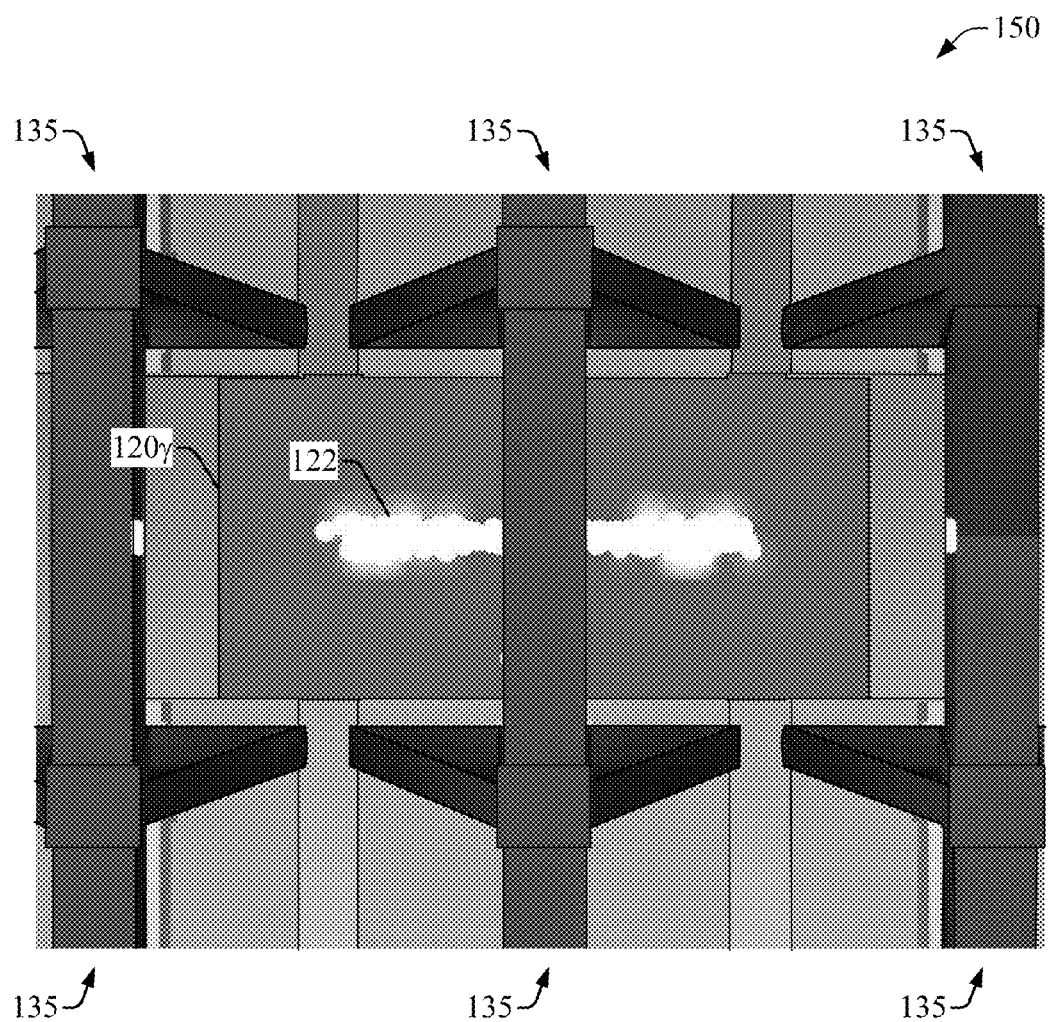

FIG. 1B illustrates an example focused light beam 122 onto receiver 120g, which can be embodied in receiver $120_1$ or $120_2$, or any other receiver described in the subject specification. The focused light pattern 122 displays non-uniformities, with broader sections near or at the endpoints of the pattern. More diffuse focused areas above and below the endpoint regions of the pattern generally arise from reflectors that are positioned slightly away from the focal distance thereof.

Details of example solar collector 100 and elements thereof are discussed next.

Figure 2:
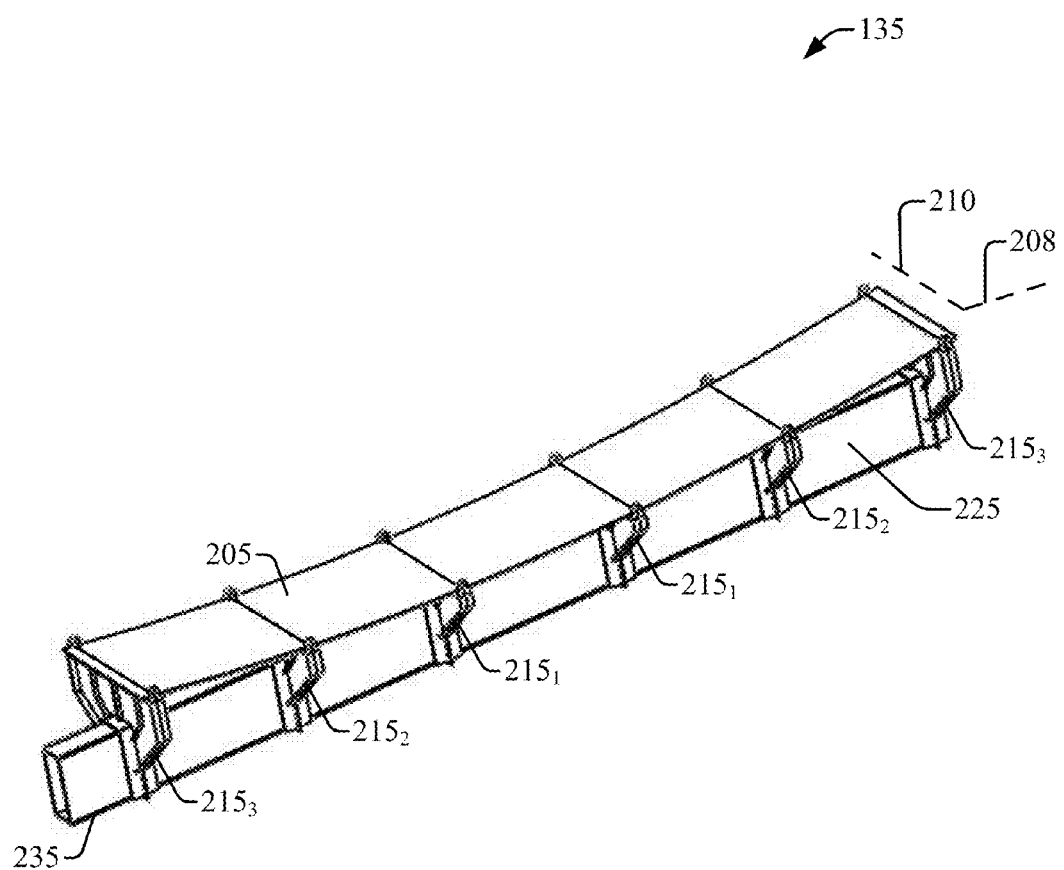
FIG. 2 illustrates an example constituent reflector, herein termed solar wing assembly in accordance with aspects described herein.

FIG. 2 illustrates an example constituent reflector 135, herein termed solar wing assembly. The solar reflector 135 includes a reflective element 205 bent into a parabolic shape, or trough shape, in a longitudinal direction 208 and remains flat in a transversal direction 210. Such deflection of reflective element 205 facilitates reflective to focus light into a line segment located at the focal point of the formed parabolic trough. It should be appreciated that for the length of the segment line coincides with the width of reflective element 135. Reflective material 205 can be substantially any low-cost material such as a metallic sheet, a thin glass minor, a highly reflective thin-film material coated on plastic, wherein the thin-film possesses predefined optical properties, e.g., fails to absorb in a range of specific wavelengths (e.g., 514 nm green laser or a 647 nm red laser), or predefined mechanical properties like low elastic constants to provide stress endurance, and so on.

In example reflector 135, six support ribs $215_1$-$215_3$, attached to backbone beam 225, bend reflective element 205 into parabolic shape. To that end, support ribs have disparate sizes and are affixed at disparate locations in beam 225 to provide an adequate parabolic profile: Outer ribs $215_3$ have a first height that is larger than a second height of ribs $215_2$, this second height is larger than a third height of inner ribs $215_1$. It should be appreciated that a set of N (a positive integer greater than three) support ribs can be employed to support reflective element 205. It is to be noted that support ribs can be manufactured with substantially any material with adequate rigidity to provide support and adjust to structural variations and environmental fluctuations. The number N and the material of support ribs (e.g., plastic, metal, carbon fiber) can be determined based at least in part on mechanical properties of reflective element 205, manufacture costs considerations, and so on.

Various techniques to attach support ribs (e.g., support ribs $215_1$-$215_3$) to backbone beam 225 can be utilized. Moreover, support ribs (e.g., support ribs $215_1$-$215_3$) can hold a reflective element 205 through various configurations; e.g, as illustrated in example reflector 135, support ribs can clamp the reflective element 205. In an aspect of the subject innovation, support ribs $215_1$-$215_3$ can be manufactured as an integral part backbone beam 225. In another aspect, support ribs $215_1$-$215_3$ can be clipped into backbone beam 225 which has at least the advantage of providing ease of maintenance and adjustment of reflective reconfiguration. In yet another aspect, support ribs $215_1$-$215_3$ can be slid along the backbone beam 225 and placed in position.

A female connector 235 facilitates to couple example reflector 135 to main structure frame 135 in example solar concentrator 100.

It should be appreciated that shape of one or more elements in example reflector 135 can differ from what has been illustrated. For example, reflective element 205 can adopt shapes such as square, oval, circle, triangle, etc. Backbone beam 225 can be have a section shape other than rectangular (e.g., circular, elliptic, triangular); connector 235 can be adapted accordingly.

Figure 3A:
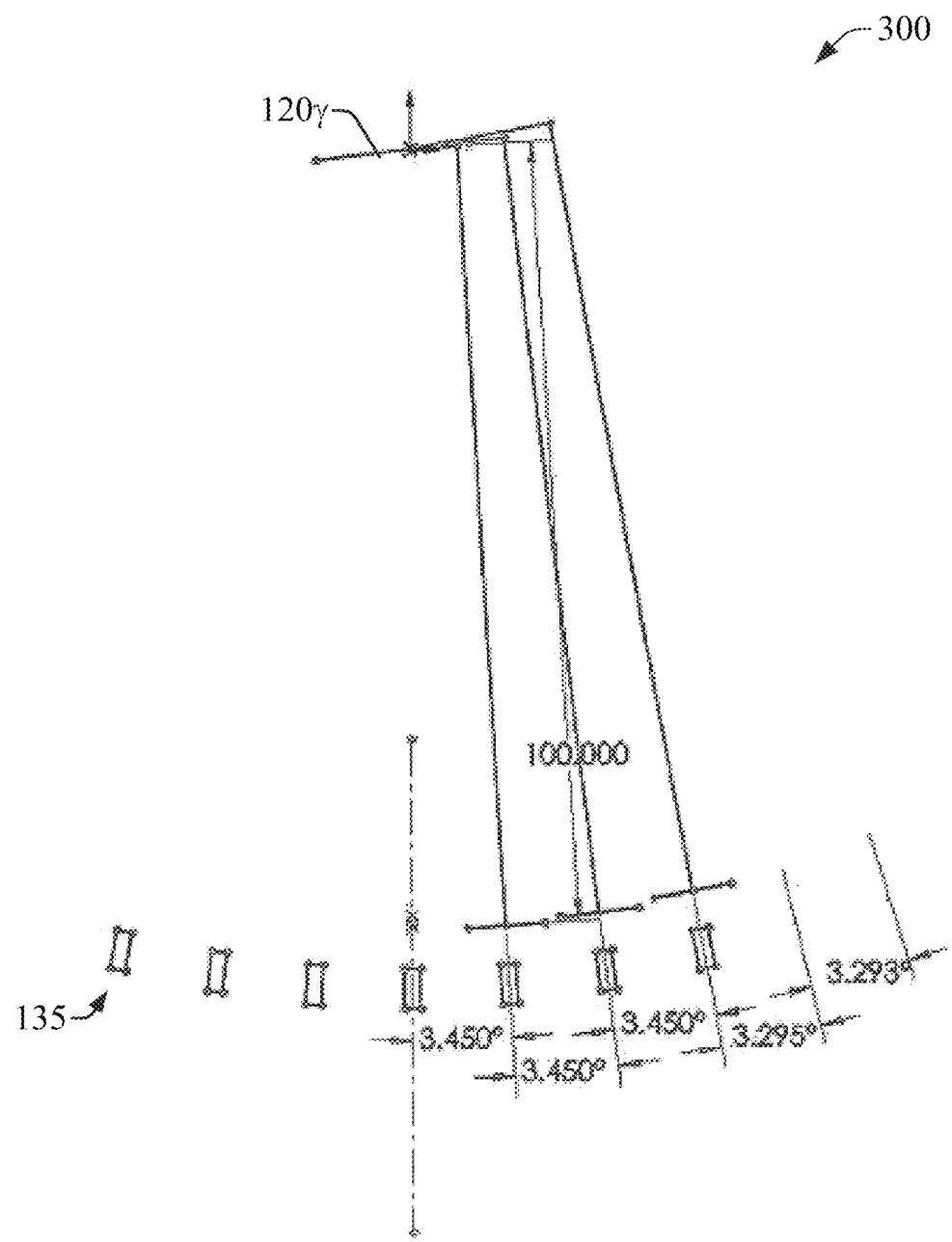
FIGS. 3A and 3B illustrates attachment positions of constituent solar reflectors to a main support beam in a solar concentrator in accordance with aspects described herein.

FIG. 3A is a diagram 300 of attachment of a solar reflector 135 to a main support beam 135. As illustrated in example parabolic solar collector 100, seven reflectors 135 are placed at focal distance from receiver $120\gamma$ with $\gamma=1, 2$. Reflectors 135 have the same focal distance by design and thus, a light beam is to be focused in a line segment (e.g., focal line). Fluctuations in attachment conditions (e.g., variations in alignment of reflector(s)) results reflector(s) positioned at a distance slightly longer or shorter than focal distance and therefore a light beam image projected onto receiver 120 can be rectangular in shape. It should be appreciated that in such configuration of reflectors, the pattern of a focused light beam on receiver 120 differs substantially form point pattern of focused light obtained through conventional parabolic mirrors, or V-shaped patterns of collected light formed by a conventional reflector that is a parabola section swept along a second parabolic path.

Figure 3B:
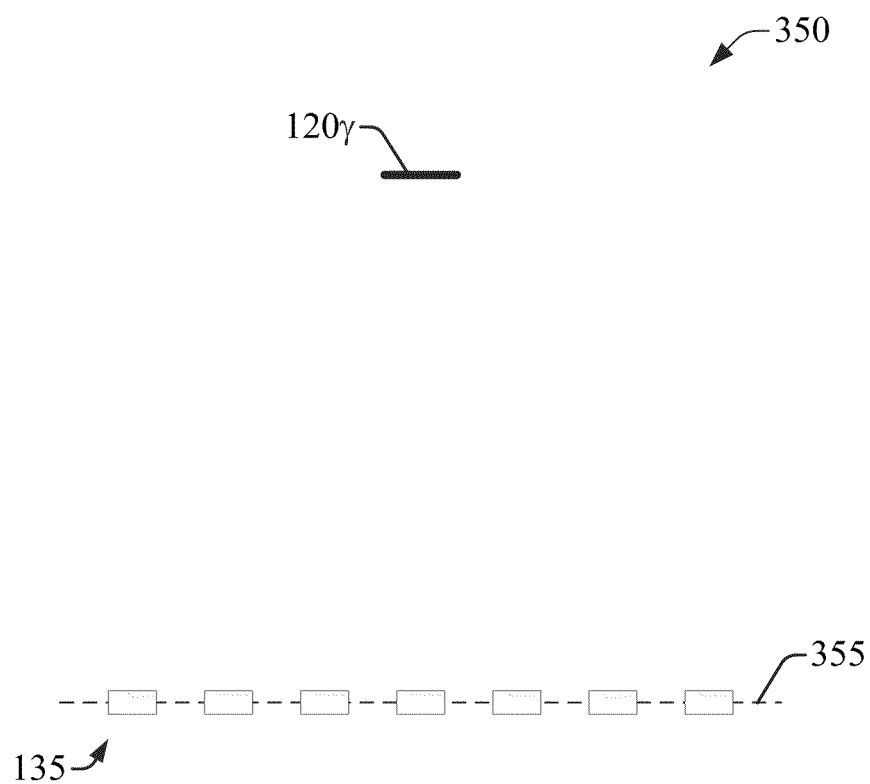

Alternatively, in an aspect, solar reflectors 135 can be attached to the main support beam 135 on a straight-line configuration, or trough design, rather than placed at the same focal distance from receiver 120. FIG. 3B illustrates a diagram 350 of such attachment configuration. Line 355 illustrates an attachment line on support frame 135.

FIGS. 4A and 4B illustrates, respectively an example single-receiver configuration 400, and an example double-receiver arrangement 450. In FIG. 4A, a light beam pattern is schematically presented in receiver $120\gamma$, the light beam pattern is substantially uniform, with minor distortions other than those associated with fluctuations that lead to a rectangular shape light projection. However, such uniformity is attained at the expense of a limited collection area; e.g., two reflector panels $130_1$-$130_2$ with seven constituent reflectors in each panel.

FIG. 4B illustrates an example collector configuration 450 that utilizes two receivers $120_1$-$120_2$ that facilitate a substantial increase in sunlight collection through a larger area, e.g., four reflector panels $130_1$-$130_4$ with seven constituent reflectors each. Configuration 450 provides at least two advantages over single-receiver configuration 400: (i) Double-receiver configuration collects twice as much radiation flux, and (ii) retains the substantial uniformity of focused light beam in single-receiver configuration. Example reflector arrangement 450 is utilized in example solar collector 100.

Figure 5:
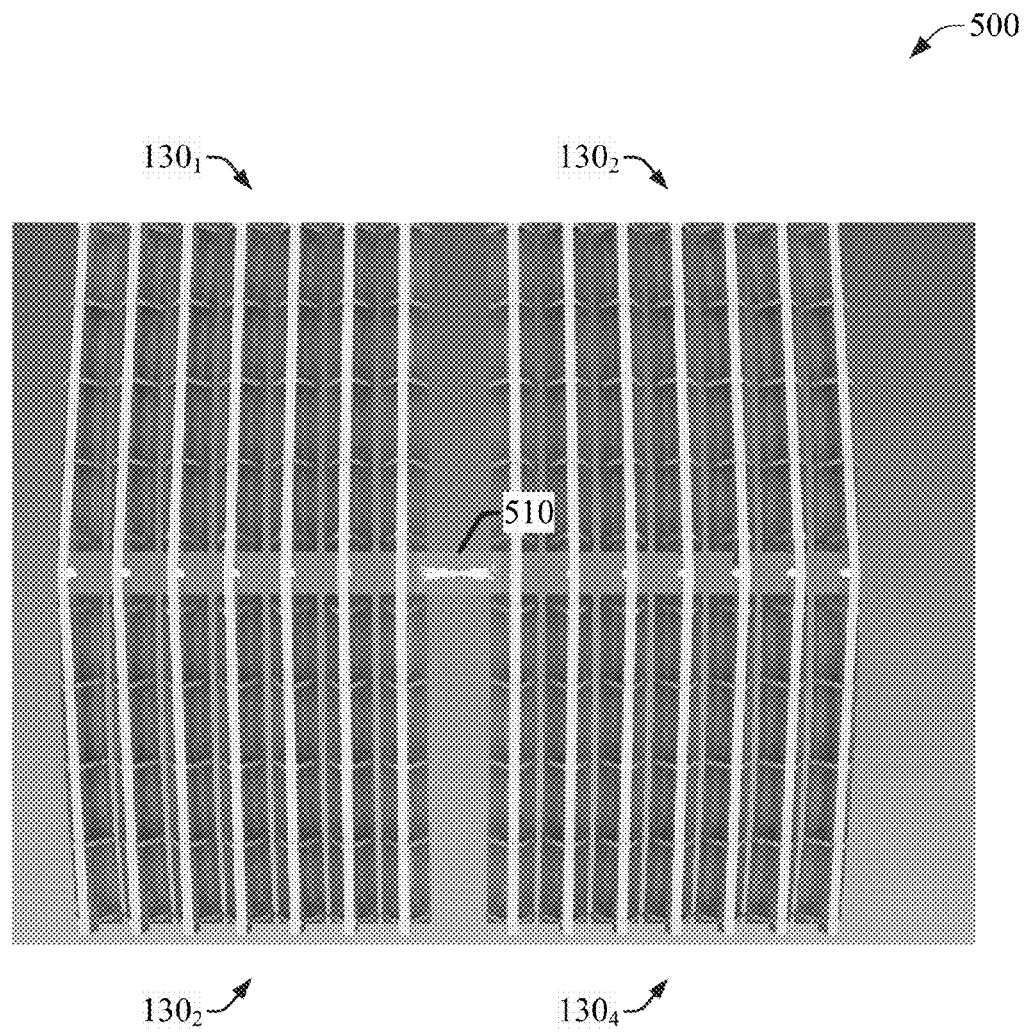
FIG. 5 illustrates a "bow tie" distortion of a collected light beam focused on a receiver in accordance with aspects described herein.

It is noted that implementation of a collection area as large as that in arrangement 450 within a single-receiver configuration can lead to substantial distortion of the focused light beam pattern. Particularly, for a large area collector with a large array of constituent reflectors that includes outer reflectors substantially distant from the receiver, a "bow tie" distortion can be formed. Thus, added complexity stemming from utilization of a second receiver and associated circuitry and active elements, is overridden by the advantages associated with uniform illumination. FIG. 5 illustrates a "bow tie" distortion of light focused onto a receiver 510 located in a center configuration for a solar concentrator with array panels $130_1$-$130_4$.

Figure 6:
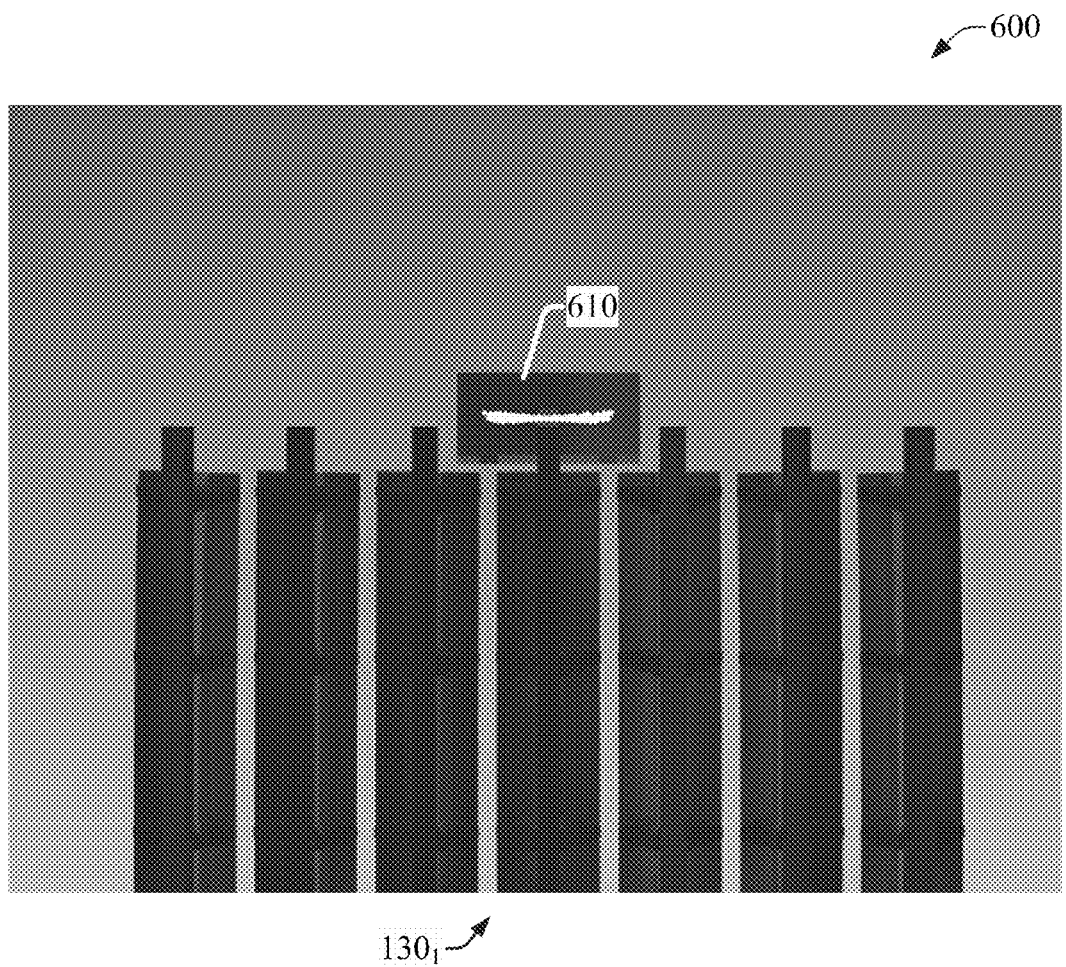
FIG. 6 is a diagram of typical slight distortions that can be corrected prior to deployment of a solar concentrator(s) or can be adjusted during scheduled maintenance sessions in accordance with aspects disclosed in the subject specification.
Figure 7:
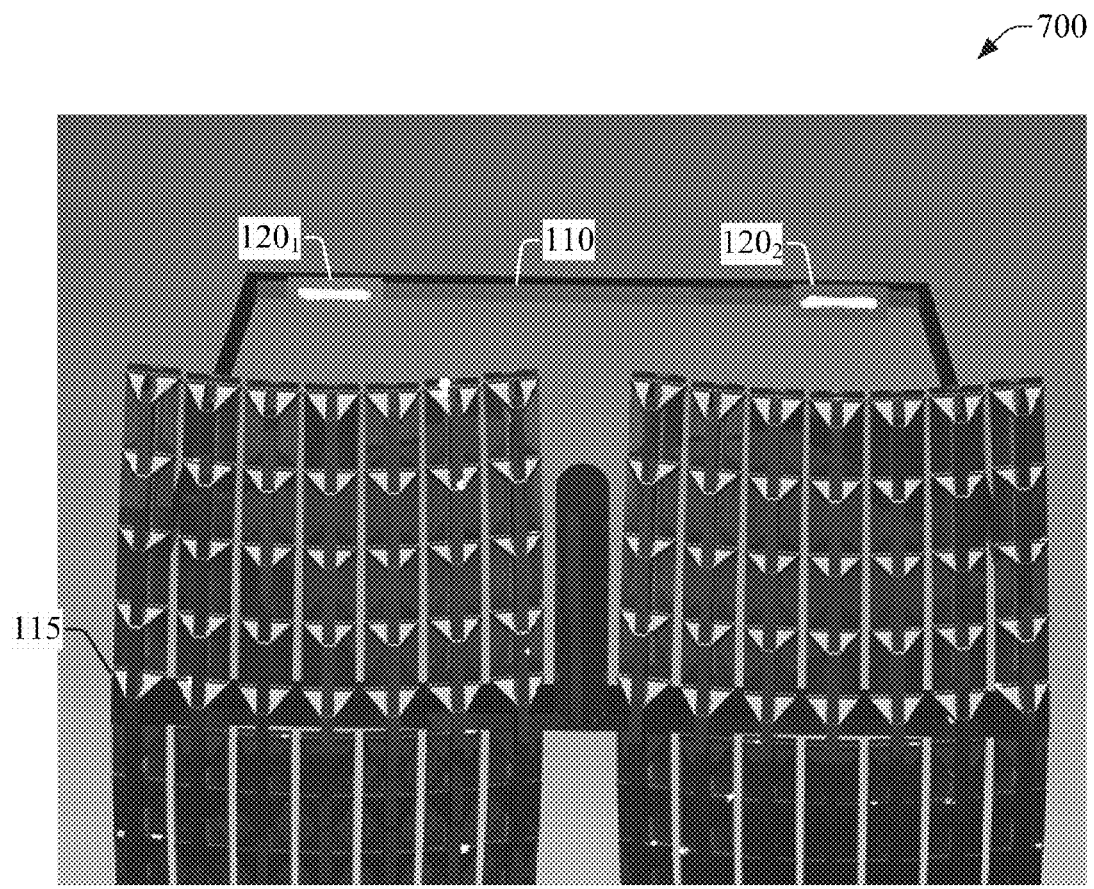
FIG. 7 illustrates a diagram of an adjusted focused light beam pattern in accordance with an aspect described herein.

FIG. 6 illustrates a diagram 600 of typical slight distortions that can be corrected prior to deployment of a solar concentrator or can be adjusted during scheduled maintenance sessions. Such distortion(s) in the image focused on receiver 610, which can be embodied in receiver $120_1$ or $120_2$, can be corrected by small adjustment(s) $\Delta\theta$ of the position of constituent reflectors, or solar wings, in a reflector panel (e.g., panel $130_1$). The adjustment(s) aims to vary the panel attachment angle $\phi$ to the central support beam 130. This adjustment(s) can be viewed as a rotational "twist" that alters $\phi$ from a value of 3.45 degrees to 3.45±$\Delta\theta$. Alternatively, or in addition, a second attachment angle $\phi$, the angle between the backbone beam 225 and a plane that contains the main support beam 135, can be reconfigured to $\phi$±$\Delta\alpha$, with $\Delta\alpha$<<$\phi$. (Typically, $\phi$ is 10 degrees.) The result of position adjustment(s) is to shift the light beam line formed by an individual common reflector panel (e.g., panel $130_1$) to more evenly illuminate receiver 120 to take further exploits the advantage(s) of PV cell characteristics. FIG. 7 illustrates a diagram 700 of an adjusted instance of the distorted pattern displayed in diagram 600.

Figure 8:
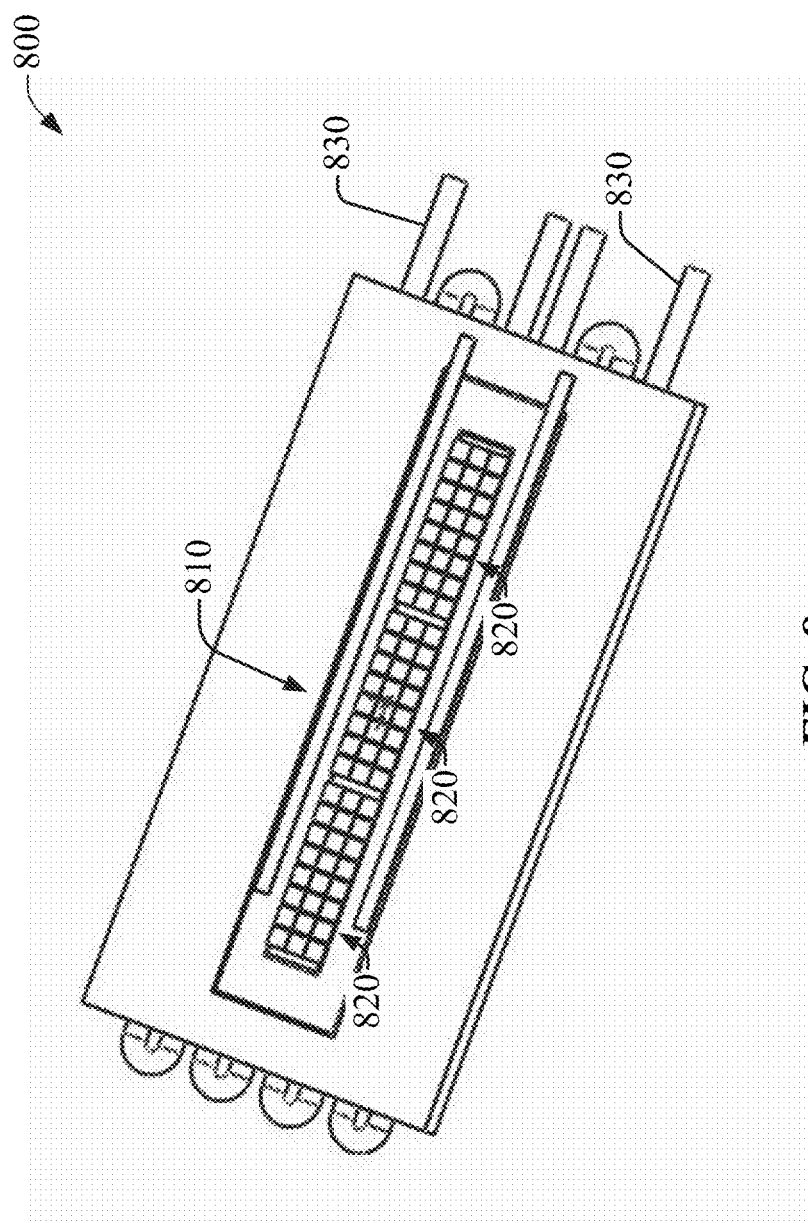
FIG. 8 is a diagram of a receiver in a solar collector for energy conversion in accordance with aspects described herein.

FIG. 8 is a diagram of example embodiments 800 of a photovoltaic receiver, e.g., receiver $120_1$ or $120_2$, for collection of sunlight for energy conversion; e.g., light to electricity. In embodiment 800, the receiver includes a module of photovoltaic (PV) cells, e.g., a PV module 810. Sets or clusters of PV cells 820 are aligned in the direction of a focused light beam (see, e.g., FIG. 1B). In addition, the sets of PV cells 820, or PV active elements, are arranged in clusters of N constituent cells and M rows, wherein the constituent PV cells within a row are electrically connected in series and rows are electrically connected in parallel; N and M are positive integers. In example embodiment 800, N=8 and M=3. Such alignment and electrical connectivity can exploit aspects of PV cells such as vertical multi-junction (VMJ) cells to take unique advantage of the narrow light beam focused on the receiver, e.g., either $120_1$ or $120_2$, to maximize electricity output. It is noted that a VMJ cell is monolithic (e.g., integrally bonded) and oriented along a specific direction, which typically coincides with a crystalline axis of a semiconducting material that composes the VMJ cell. It should be appreciated that PV cells utilized in PV module 810 can be substantially any solar cell such as crystalline silicon solar cells, crystalline germanium solar cells, solar cells based on III-V group of semiconductors, CuGaSe-based solar cells, CuInSe-based solar cells, amorphous silicon cells, thin-film tandem solar cell, triple-junction solar cells, nanostructured solar cells, and so forth.

It should be appreciated that example embodiment 800 of a PV receiver can include serpentine tube(s) 830 which can be utilized to circulate a fluid, or liquid coolant, to collect heat for at least two purposes: (1) to operate PV cell(s) in clusters or sets 820 within an optimal range of temperatures, since PV cell efficiency degrades as temperature increases; and (2) to utilize the heat as a source of thermal energy. In an aspect, serpentine tube(s) 830 can be deployed in a pattern that optimizes heats extraction. Deployment can be effected by embedding, at least in part, a portion of serpentine tube(s) 830 in the material that comprises the PV receiver (see, e.g., FIG. 9A).

Figure 9A:
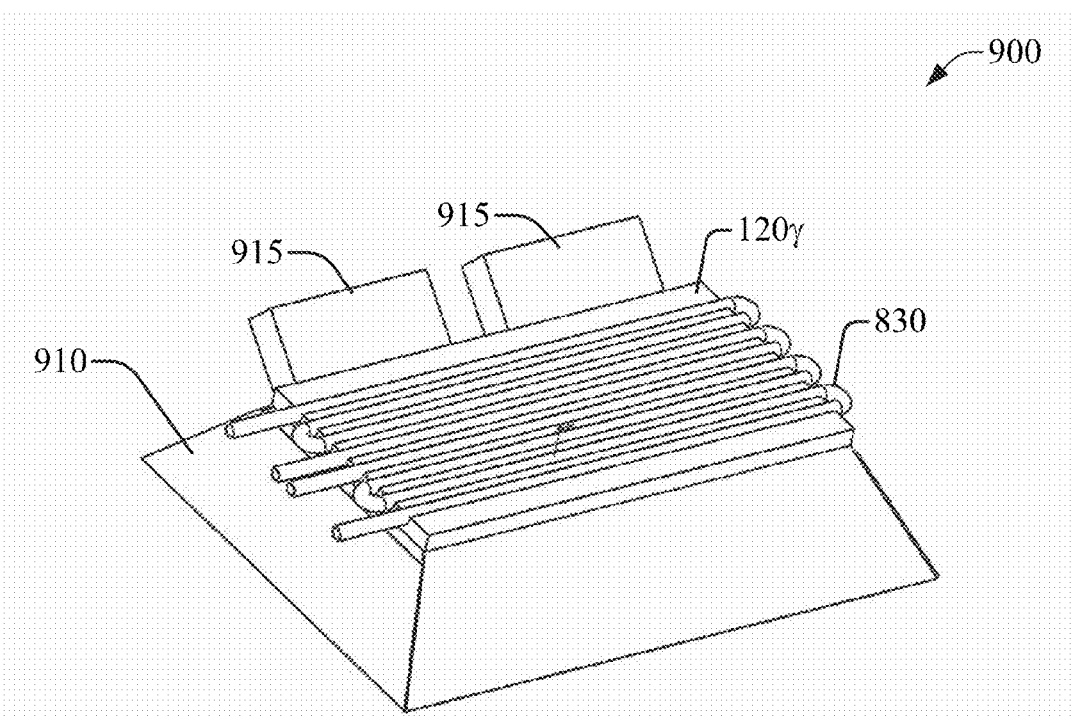
FIGS. 9A-9B illustrates diagrams of a receiver in accordance with aspects described herein.
Figure 9B:
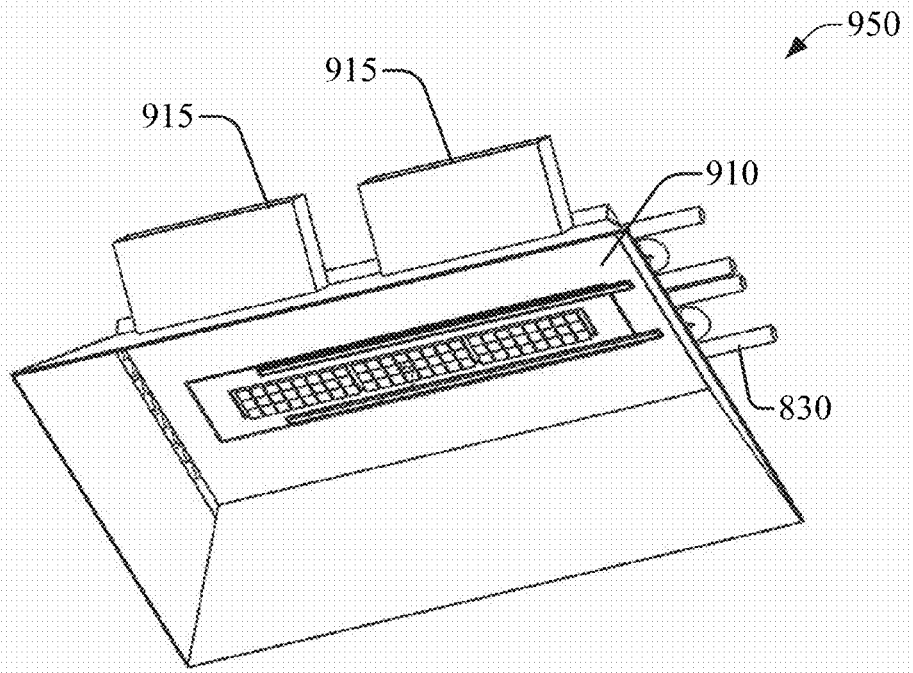

FIGS. 9A-9B illustrates diagrams 900 and 950 of a receiver 120 in which a casing 910 is attached to the receiver. Casing 910 can shield a human agent or operator that installs, maintains, or services solar concentrator 100 from exposure to focused light beam(s) and associated elevated temperatures. Casing 910 includes exit nozzles 915 that develop a passive hot airflow across the PV cells in receiver $120_{\gamma\gamma}$ in order to reduce the accumulation of concentrated hot air which may distort the light beam that reaches the PV module. Exhaustion or reduction of a hot air layer results in higher electrical output. Exhaustion can be improved by adding small active cooling fans in nozzles 915.

Figure 10:
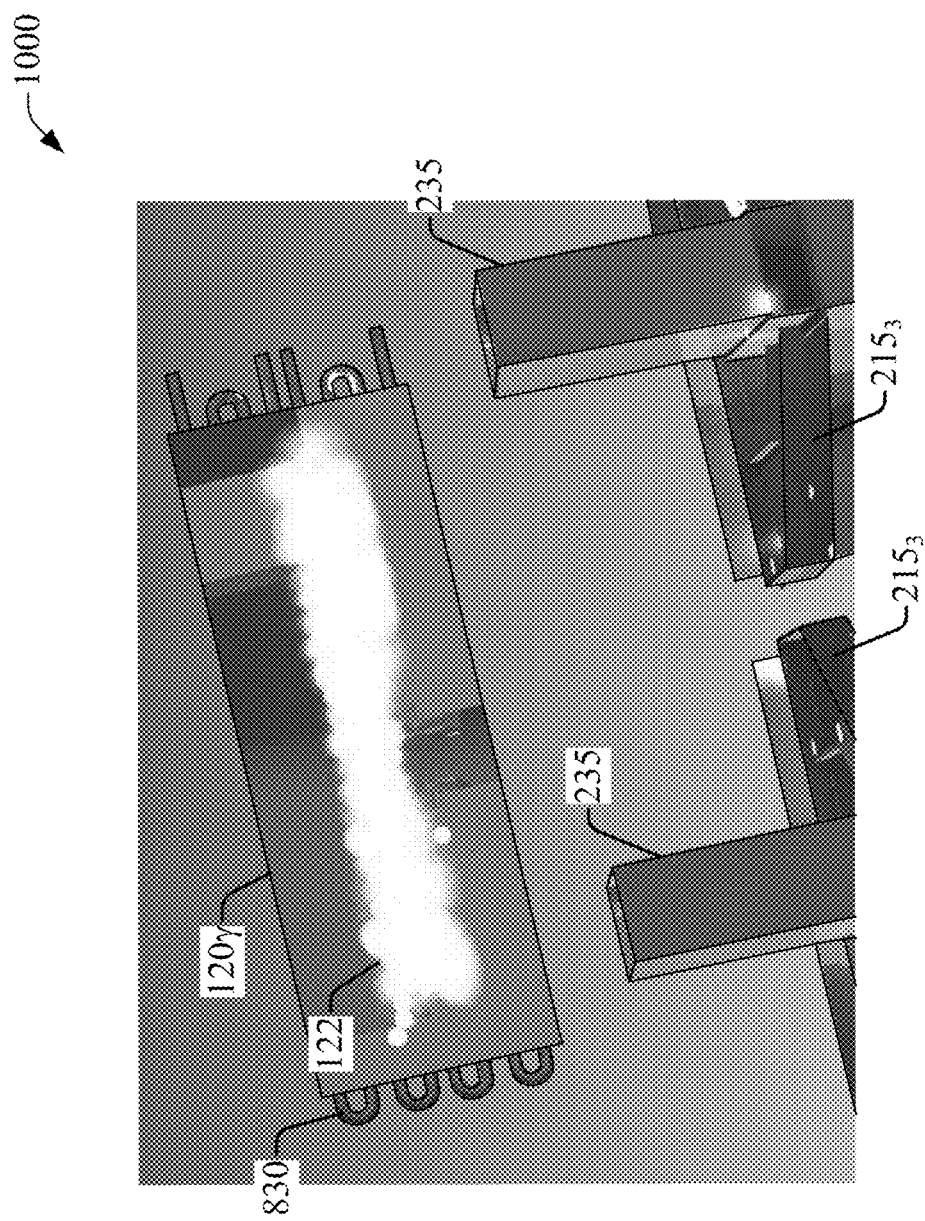
FIG. 10 is a rendition of a light beam pattern focused on a receiver in accordance with aspects described herein.

FIG. 10 is a rendition 1000 of a light beam pattern 122 focused on receiver 120, which includes PV active elements (illuminated) and serpentine 830. Pattern fluctuations are visible; for example, light beam pattern 122 is narrower in the central region of receiver $120\gamma$ while is widens towards the end(s) of the receiver 120. Such pattern shape is reminiscent of the "bow tie" distortion discussed above. It should be appreciated that detrimental effects to performance caused by such fluctuations, or distortions, of light beam pattern 122 can be mitigated through various arrangements of PV cells as discussed below.

Figure 11A:
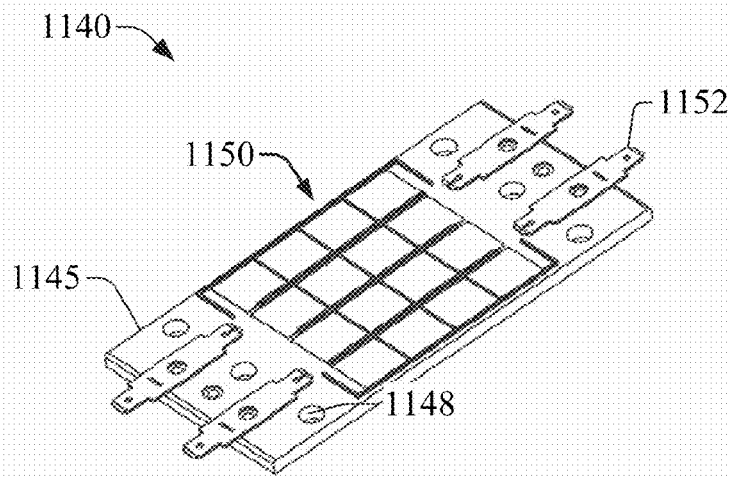
FIGS. 11A-11B display example embodiment of PV modules in accordance with aspects described herein.
Figure 11B:
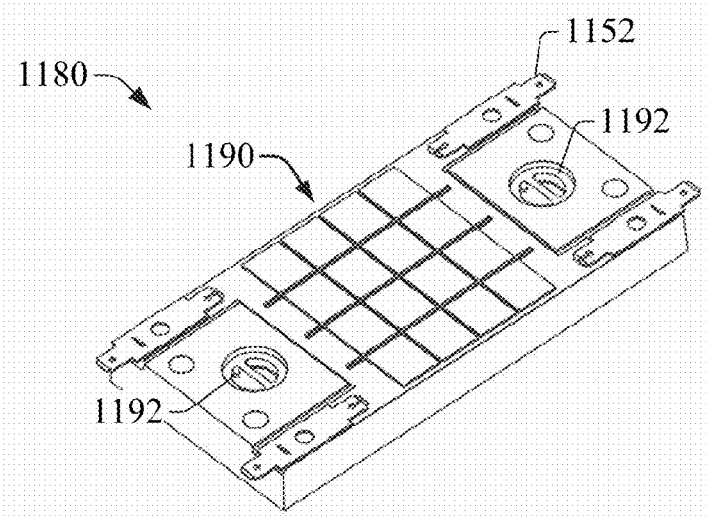

FIGS. 11A-11B display example embodiments of PV modules in accordance with aspects of the subject innovation. In embodiment 1140 illustrated in FIG. 11A, the PV receiver is made of a metal plate 1145 onto which a PV module 1150 is attached, e.g., bonded through an epoxy or other thermally conductive or electrically insulating adhesive material, tape or similar bonding material, or otherwise adhered into the metal surface of the receiver. In illustrated embodiment 1140, PV module 1150 includes a layout of N=4 constituent cells, rendered as square blocks, and M=4 rows. In embodiment 1140, the PV module includes six cavities 1148 to bolt or fasten the PV module to a support structure, e.g., post 110. In addition, the illustrated embodiment 1100 includes four additional fastening means 1152.

In example embodiment 1180, displayed in FIG. 11B, PV module 1190 is made of a metal plate 1185 onto which a cluster of PV cells 1150 is deployed. As described above, the cluster includes N=4 constituent cells, rendered as square blocks, and M=4 rows, and the metal plate includes four fastening means 1152. In an aspect, in embodiment 1180, the metal plate the forms the PV module embodies a semi-open casing that can allow fluid circulation through orifices 1192 for refrigeration of the PV module or thermal energy harvesting. It should be appreciated that in embodiment 1180, the PV module does not include a thermal harvesting or refrigerating apparatus such as serpentine tube(s) 1130 or other conduits, but rather the PV module 1190 can be assembled or coupled with a refrigerating or thermal harvesting unit as described below.

Figure 12:
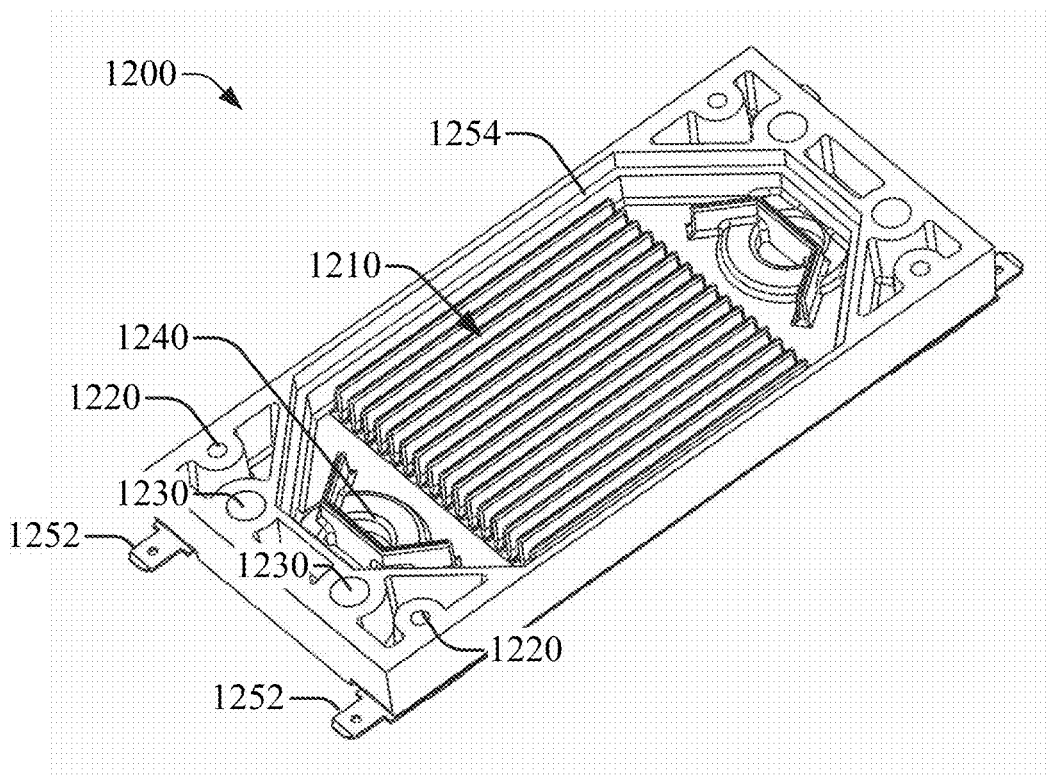
FIG. 12 displays an embodiment of a channelized heat collector that can be mechanically coupled to a PV module to extract heat there from in accordance with aspects of the subject innovation.

FIG. 12 displays an embodiment of a channelized heat collector 1200 that can be mechanically coupled to a PV module (not shown in FIG. 12) to extract heat there from in accordance with aspects of the subject innovation. Active cooling or heat transfer medium can be embodied in a fluid that circulates through the plurality of Q channels or conduits 1210, with Q a positive integer number. Channelized heat collector 1200 can be machined in an individual metal piece, e.g., Al or Cu piece, or substantially any material with a high thermal conductivity. In an aspect, a first orifice 1240 can allow coolant fluid to enter the channelized heat collector and a second orifice allows the coolant fluid to egress. Orifices 1220 or 1230 allows the channelized heat collector 1200 to be fastened, e.g., screwed or bolted, to the PV module (not shown). Additional fasteners 1252 can be present to enable attachment to the PV module. It is noted that a cover hard sheet (not shown) can be laid out on the open surface of the channelized heat collector 1200 to close and seal, in order to prevent leakage of coolant fluid, the channelized collector 1200; the cover hard sheet can be supported by a ridge 1254 in the internal side surface of the channelized heat collector 1200. The cover hard sheet can be a thermoelectric material that exploits the heat harvested by the fluid circulating through the channelized heat collector to produce additional electricity that can supplement electric output of a cooled PV module. Alternatively or additionally, a thermoelectric device can be attached in thermal contact with the hard cover sheet in order to produce supplemental electricity.

Channelized heat collector 1200 is modular in that it can be mechanically coupled to disparate PV modules, e.g., 1380, at a time to harvest thermal energy and cool the illuminated PV modules. At least an advantage of the modular design of channelized heat collector 1200 is that it can be efficiently and practically reutilized after a PV module operational lifetime expires; e.g., when a PV module fails to supply an electric current output that is cost effective, the PV module can be detached from the channelized collector and new PV module can be fastened thereto. At least another advantage of channelized heat collector is that the fluid that act as heat transfer medium can be selected, at least in part, to accommodate specific heat loads and effectively refrigerate disparate PV modules that operate at different irradiance, or photon flux.

In an aspect, PV elements can be directly bonded to channelized collector 1200, on a surface opposite to surface of the hard cover sheet that closes and seals the channelized collector. Thus, the channelized collector servers as a support plate for the PV cells, while it provides cooling or heat extraction. It is noted that a set of channelized collectors 1200 can be fastened to a support structure to form a PV receiver; for example, 120₁. At least an advantage of modular configuration of the set of channelized collectors 1200 is that when PV elements are bonded to each of the collectors in the set and one or more of the PV elements in a collector is in failure, the affected PV elements and supporting channelized collector can be replaced individually without detriment to operation of disparate collectors and associated PV cells in the set of channelized collector 1200.

Figure 13:
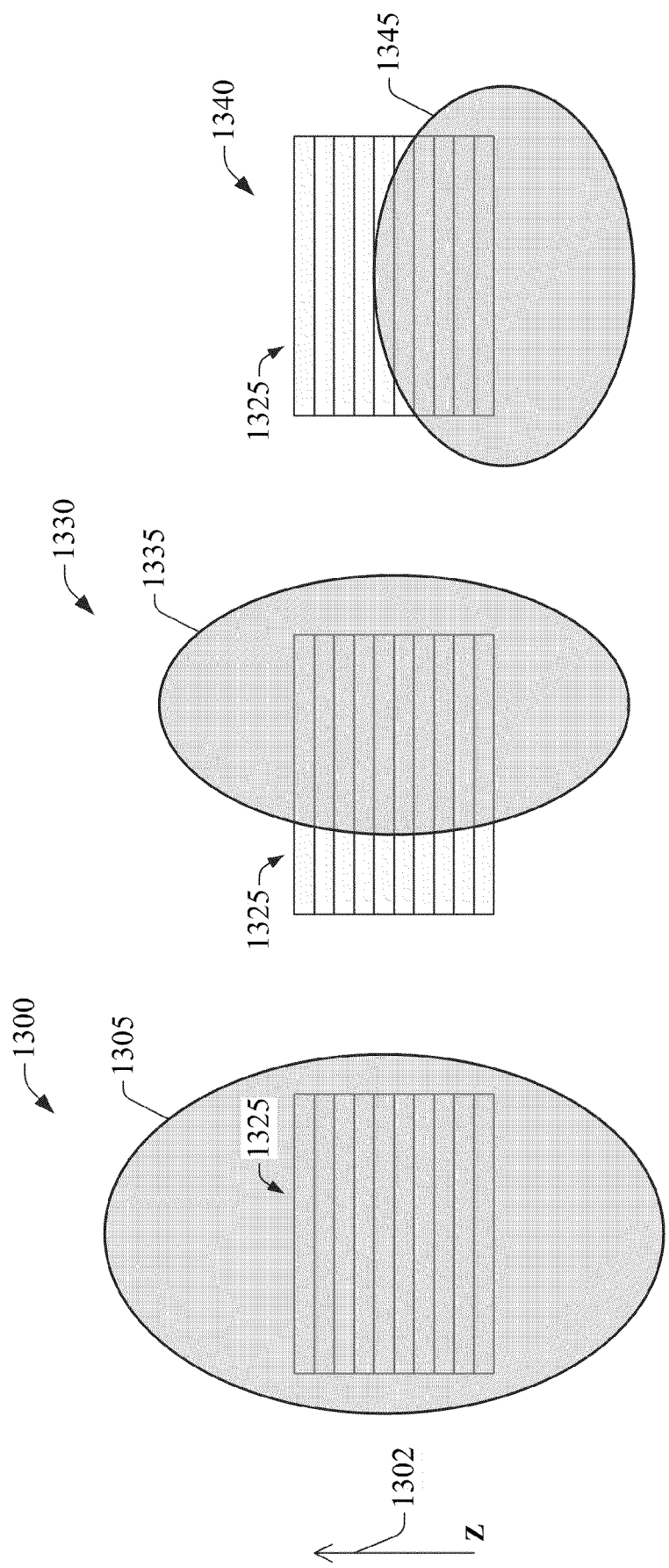
FIGS. 13A-13C illustrate example scenarios for illumination of active PV element(s) through sunlight collection via parabolic solar concentrator in accordance with aspects described herein.

FIGS. 13A-13C illustrate three example scenarios for illumination, through sunlight collection via parabolic solar concentrator 100, of active PV element that can be part of PV module 810. In an aspect of the subject innovation, the active PV element is a monolithic (e.g., integrally bonded), axially oriented structure that includes a set of N (N a positive integer) constituent, or unit, solar cells (e.g., silicon-based solar cells, GaAs-based solar cells, Ge-based solar cells, or nanostructured solar cells) connected in series. The set of N solar cells is illustrated as block 1325. The solar cells produce a serial voltage $\Delta V \approx N \cdot \Delta V_C$ along the axis Z 1302 of the structure, wherein $\Delta V_C$ is a constituent cell voltage. Individual PV cells produce energy at low voltages; most cells output 0.5 V. Thus, to generate substantial electrical power, current tends to be high in view of low voltages available. However, substantive current can cause significant power losses associated with series resistance since such power losses are proportional to $I^2$, with I an electrical current transported through the series resistance. Accordingly, system level power losses can increase rapidly with high current and low voltages. The latter results in solar energy conversion designs which utilize solar cells interconnected in a series configuration in order to increase voltage output.

Structure 1325 represents an example vertical multi-junction (VMJ) solar cell. In an aspect of a VMJ solar cell, a set of N constituent solar cells is stacked along a growth direction Z 1302, each constituent cell has a p-doping layer near a first interface of the cell with a disparate cell, and an n-doped layer near a second interface wherein the first and second interfaces are planes normal to the growth direction Z 1202. In an another aspect of a VMJ cell, under typical operation conditions, a 1 $cm^2$ VMJ solar cell can output nearly 25 volts because generally N~40 constituent cells are connected in series. Thus, eight VMJ solar cells electrically connected in series can produce nearly 200 V. Furthermore, connection in series of the constituent solar cells in the VMJ solar cell can lead to a low-current state when the VMJ solar cell is not illuminated uniformly or a failure, open-circuit condition when one or more of the constituent solar cells in the VMJ solar cell is not illuminated, since current output of a chain of series-connected electrically active elements, such as the constituent solar cells upon illumination, is typically limited by a cell that produces the lowest amount of current. Under non-uniform illumination, produced power output substantially depends on the details of collected light incident on the VMJ cell, or substantially any or any active PV element. Therefore, it should be noted that solar concentrators are to be designed in such a manner as to provide uniform illumination of the VMJ solar cell, or substantially any or any active PV element (e.g., a thin-film tandem solar cell, a crystalline semiconductor-based solar cell, an amorphous semiconductor-based solar cell, a nanostructure-based solar cell . . . ) interconnected in series.

FIG. 13A displays an example scenario 1300 in which an illustrative focused beam 1305 of oblate shape covers the entirety of a surface of PV element 1325. Thus, illumination is regarded as optimal. FIG. 13B presents an example scenario 1330 that is sub-optimal with respect to power or energy output as a result of partial illumination of the constituent solar cells, represented as rectangles, in PV active element 1325—e.g., full width of unit or constituent solar cells fails to be illuminated through focal region 1335. FIG. 13C is an example scenario 1340 of operation failure, e.g., zero-output condition, as focus region 1345 fails to illuminate a subset of the set of constituent solar cells in PV active element 1325, and thus power output is null since no voltage occurs at non-illuminated constituent solar cells.

Figure 14:
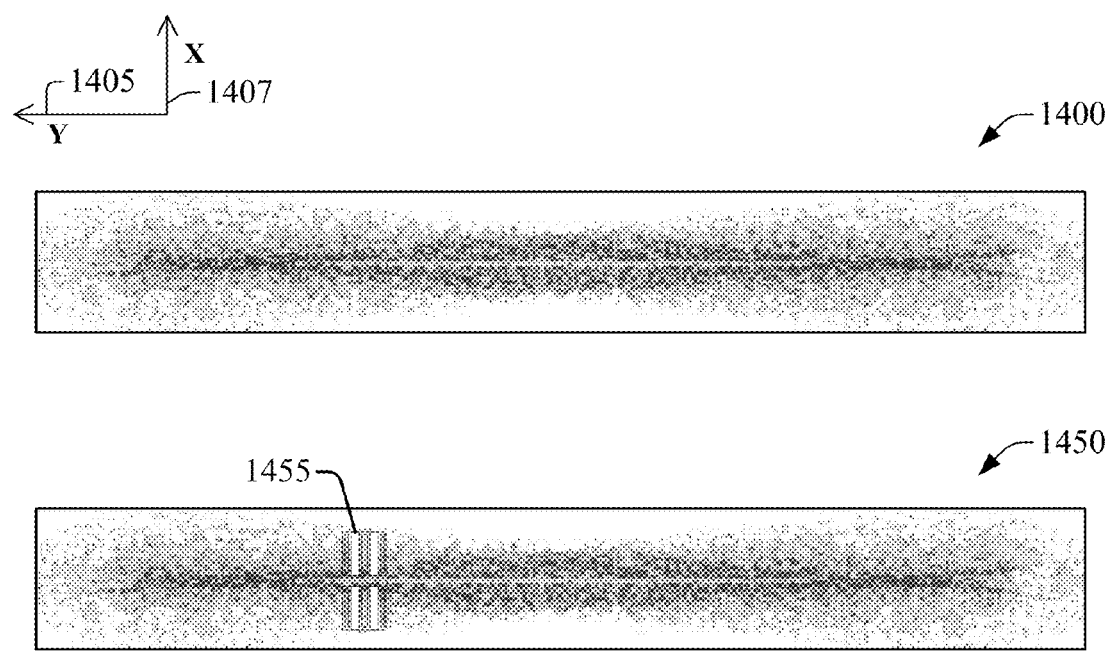
FIG. 14 is a plot of a computer simulation of the light beam distribution for a parabolic concentrator in accordance with aspects disclosed in the subject specification.

FIG. 14 displays a plot 1400 of a computer simulation of distribution of light collected through example parabolic concentrator 100. The simulation (e.g., a ray-tracing model which can include optical properties of reflective material 205) reveals a non-uniform pattern of light in direction Y 1405, normal to the axis of the VMJ cell, and in the orthogonal direction X 1407. The particular spread characteristics of light focal area originate from a distribution of positions about the focal point of multiple reflectors, e.g., reflectors 135, that comprise a solar collector (e.g., solar collector 100); the multiple reflectors generate multiple, relatively misaligned images that are superposed at the receiver. It should be appreciated that as the area of collection (e.g., area of panels $130_1$-$130_4$) increases and additional mirrors, or reflectors, are added, the light distributed at the focal point can become increasingly non-uniform.

Additionally, FIG. 14 presents diagram 1450 which illustrates an example prescribed positioning and alignment of a pair of VMJ cells 1455 relative to the optical image that a solar collector, e.g., 100, generates; image in diagram 1450 is same as that in diagram 1400. One or more VMJ cells, or substantially any or any PV active elements, can be added on the sides of VMJ cells 1455 along direction Y 1405; e.g., the direction parallel to top beam in support frame 130; generally, a pattern or configuration of the VMJ cells is to be layout so as to have reflection symmetry through the main axis, e.g., axis parallel to directory Y 1405, of the optical image of the a focused light beam.

It is noted that in a solar concentrator that produces thermal energy, this non-uniformity of illumination predicted by simulations and observed experimentally does not affect performance because thermal energy is effectively integrated within an illuminated thermal receiver, e.g., back-mounted serpentine tube(s) 830. However, when PV cells are located near a focal locus (e.g., a point or a line) of collected light, non-uniform illumination can result in a poor illumination of a portion of PV cells (see, e.g., FIGS. 13A-13C) and thus substantially reduce energy conversion performance; e.g., reduce power output of a set of PV cells within a PV module.

It should be appreciated that solar concentrators disclosed in the subject innovation, e.g., solar concentrator 100, are designed tolerate spatial fluctuations (e.g., dimensional variations of various structural elements) within the structure's construction. In addition, the disclosed solar concentrators, e.g. 100, also can tolerate environmental fluctuations such as (i) substantial daily temperature gradients, which can be a common occurrence in some deployments sites with desert-like weather conditions (e.g., Nevada, US; Colorado, US; Northern Australia; and so forth); and severe storm conditions like high-speed winds and hailstorms, or the like. It should be readily understood that environmental fluctuations can substantially affect structural conditions, which in addition to substantially any type of stress(es) can offset focused sunlight from a designed or intended focal locus. The fluctuations, or variations, typically shift portions of a focused light pattern up or down in the direction of a minor axis of a support beam for the solar receiver, and left or right in the direction of the major axis of the support beam vertical centerline. By positioning PV active elements (e.g., VMJ solar cells, triple junction solar cells) 820 within an optimal location, e.g., a location referred informally as a "sweet spot," within the intended focal light pattern, for example, the light pattern overlapping the PV cell(s) pattern, detrimental effects associated with such variations in the light patterns can be mitigated because PV active element(s) can remain illuminated even though light focus may shift.

As discussed below, PV elements can be configured or arranged in layouts that ensure light incidence on the PV elements substantially irrespective of fluctuations of light focus. In an aspect of the subject innovation, by orienting PV cells (e.g., VMJ solar cells) on a receiver as discussed below, output of parabolic solar collector system 100 can be substantially resilient to non-uniform illumination at the focal locus (e.g., point, line, or arc) because each unit cell within a VMJ cell can have at least a portion of its side section (e.g., width) illuminated; see, e.g., FIG. 13B and associated description. Accordingly, VMJ solar cells, or substantially any or any PV active elements, are to be oriented with their series connections aligned with the main axis (e.g., Y 1405) of the optical image.

Figure 15A:
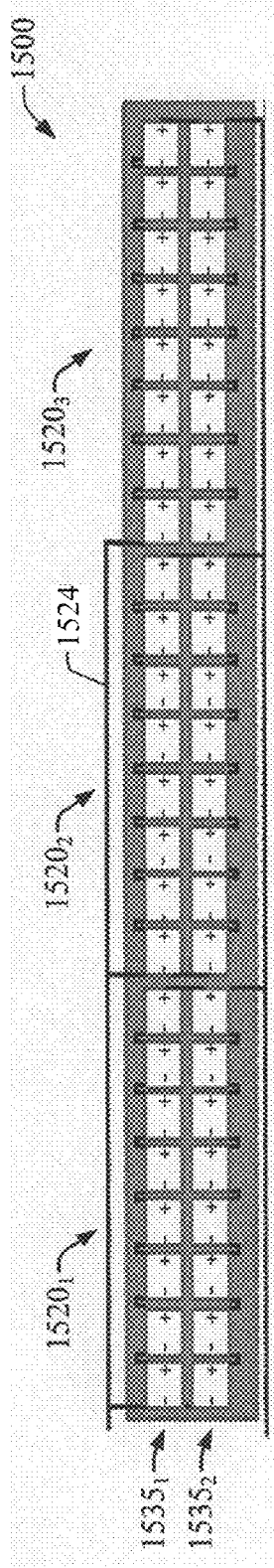
FIGS. 15A-15C illustrate examples of cluster configurations of PV cells in accordance with aspects described herein.
Figure 15B:
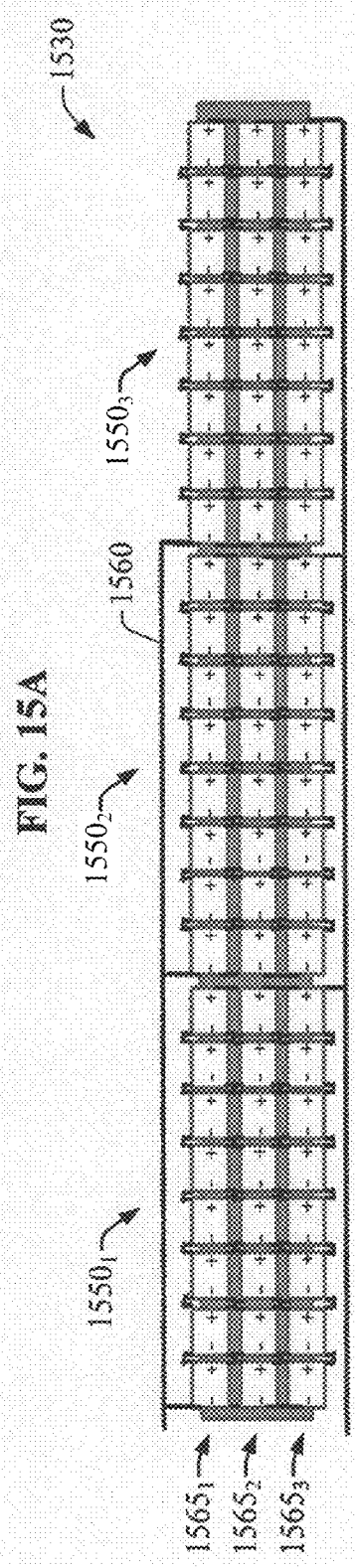
Figure 15C:
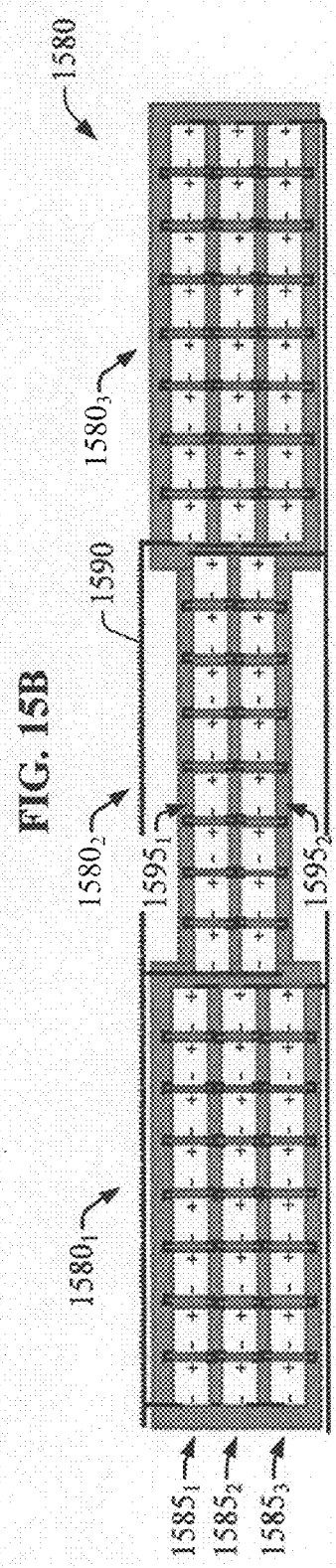

FIGS. 15A-15C illustrate examples of cluster configurations, or layouts, of VMJ solar cells that can be exploited for energy conversion in a parabolic solar concentrator 100. While the description below refers to VMJ solar cells, it is noted that other alternative or additional PV active elements (e.g., thin-film tandem solar cells) can be configured in substantially the same manner. FIG. 15A displays three clusters $1520_1$-$1520_3$ of K=2 rows, or strings, $1535_1$ and $1535_2$ of VMJ solar cells, each row includes M=8 VMJ cells which are connected in series and each can comprise nearly 40 constituent solar cells. Clusters $1520_1$-$1520_3$ are connected through a wireline or negative voltage bus 1560 and a positive voltage bus (see also FIG. 16). Rows are connected in parallel to increase current output. It is noted that the number M (a positive integer) of VMJ cells in a row within a cluster can be larger or smaller than eight based at least in part upon design considerations, which can include both commercial (e.g., costs, inventory, purchase orders) and technical aspects (e.g., cell efficiency, cell structure). For example, clusters $1520_1$-$1520_3$ can result from a design that aims to generate ΔV=200 V through VMJ cells that produce 25 V each. Likewise, K (a positive integer) can be determined in accordance with design constraints primarily related to spatial spread of light beam focused on a sunlight receiver 120 (see also FIG. 14). Clusters of VMJ cells are connected in series. A wire 1524 is routed on the backside of the sunlight receiver.

As described supra, focused light tends to be non-uniform across the length of the receiver (oriented along Y 1205 direction) toward the ends of the focused pattern. Therefore, in an aspect, an additional cluster can be added in a "split" layout, with four VMJ cell pairs located at one end, and another four VMJ solar cell pairs making up the balance of the cluster being positioned at the other end. This "split cluster" configuration trades off performance in one cluster (the one split at either end), rather than 2 clusters (one at each end). The 2 halves of the split cluster may be interconnected with a wire 1560 that is routed through and along the backside of the receiver.

FIG. 15B illustrates a layout 1530 in which three rows $1565_1$-$1565_3$ of PV active elements are configured. Configuration includes three PV clusters $1550_1$-$1550_3$, connected through a wireline or bus 1560 (see also FIG. 16). Spatial distribution of the PV active elements is typically wider than an anticipated spatial distribution of a focused light pattern; such width can be estimated through simulations like those presented in FIG. 14. Configuration 1530 can be implemented when costs of PV active element(s), e.g. (VMJ solar cells) are viable. Such configuration can retain desired system (e.g., solar concentrator 100) tolerance to structural fluctuations, manufacture imperfection(s) (e.g., dimensional errors) and structural shifts, because it provides a larger target area for the shifted light to fall on. In this configuration scenario, additional VMJ solar cell area is introduced with the introduction of the third row, some of the area may not be illuminated and this be non-operational; however, a net increase in operational (e.g., illuminated area is attained and thus at least one advantage of configuration 1530 is that more radiation is utilized. It should be appreciated that the relative cost utility, or tradeoff, of utilization of a larger VMJ solar cell footprint and a larger light beam footprint is a function at least in part of relative cost(s) and efficiency of solar concentrator 100 structure and reflective elements (e.g., mirrors) versus relative cost(s) and efficiency of PV active elements (e.g., VMJ cells).

FIG. 15C illustrates example configuration 1580 wherein clusters with disparate structure can adjust in accordance with expected (see FIG. 14) spatial variation of focused light beam pattern; e.g., variations in width along direction X 1407 of a focused image throughout the length of the receiver.

To adjust PV active elements layout, clusters can be varied in width (e.g., the number of VMJ solar cells in parallel, within a string, or row, can be adjusted throughout the length of the receiver). In an aspect, side clusters $1580_1$ and $1580_3$ comprise K=3 rows, $1585_1$-$1585_3$, and M=8 PV elements per row, while a center cluster $1580_2$ may be K=2 rows, e.g., $1595_1$ and $1595_2$, of PV active elements wide. Clusters $1580_1$-$1580_3$ are connected in parallel through wireline, or positive voltage bus, 1590.

In example configuration scenarios 1500, 1530, and 1580, as well as in any configuration that utilizes PV active elements (e.g., VMJ solar cells) in a series-connected string, performance of a cluster is limited by the PV element with lowest performance because such element is a current output bottleneck in the series connection, e.g., current output is reduced to the current output of the lowest performing PV active element. Therefore, to optimize performance, strings of PV active elements can be current-matched based on a performance characterization conducted in a test-bed under conditions (e.g., wavelengths and concentration intensity) substantially similar to those expected normal operating conditions of the solar collector system.

In addition, current-matched strings can be arranged geometrically to optimize power generation. For example, when three strings (e.g., rows $1565_1$-$1565_3$) are connected in parallel to form a cluster, a middle string (e.g., row $1565_2$) can include the highest performance current-matched PV active elements, since the middle string is likely to be positioned in the optimal location of the focused collected light beam or optical image. Moreover, top string (e.g., $1565_1$) can be the second highest performing string, and bottom string (e.g., $1565_3$) can be the third highest performing string. In such arrangement, when the image shifts upward, the top and middle string can be fully illuminated while the bottom string is likely to be partially illuminated, providing higher power output than when the focused light beam image shifts downward thus illuminating the middle and lower string in full while the top string is partially illuminated. When substantially all clusters of PV active elements (e.g., VMJ cells) are configured with lower performing PV active elements in a bottom row, highest performing cells at the middle of the arrangement, and next highest performing elements in top string, a tracking system (e.g., system 1700) utilized to adjust position of collector panels (e.g., $130_1$-$130_4$) to track, at least in part, sun's position can be employed to adjust the configuration of collector panels or reflector(s) therein so that the light beam focused image shifts towards the top of a receiver (e.g., $120_y$) during concentrator operation in order to maximize electrical output—e.g., middle and top rows in configuration 1530 are preferentially illuminated. Additionally or alternatively, the tracking system can be employed to adjust position of collector panels or reflector(s) therein in order to maximize energy-conversion performance, or electrical output, in scenarios in which PV elements in a PV module, e.g., 810, are not current matched or otherwise matched.

It should be appreciated that configurations or patterns, or cell size (e.g., length and width) and shape of the PV active elements are not limited to those illustrated in FIGS. 15A-15C or those generally discussed above. Solar cells size and shape can be varied to match concentrated light patterns generated by various possible mirror, or reflector, constructions. Furthermore, arrangements or configurations of PV elements can be lines, squares, bowties, arcs or other patterns to take advantage of unique features or aspects of the PV elements; for example, the monolithic, axially-oriented characteristic of VMJ solar cells.

Figure 16C:
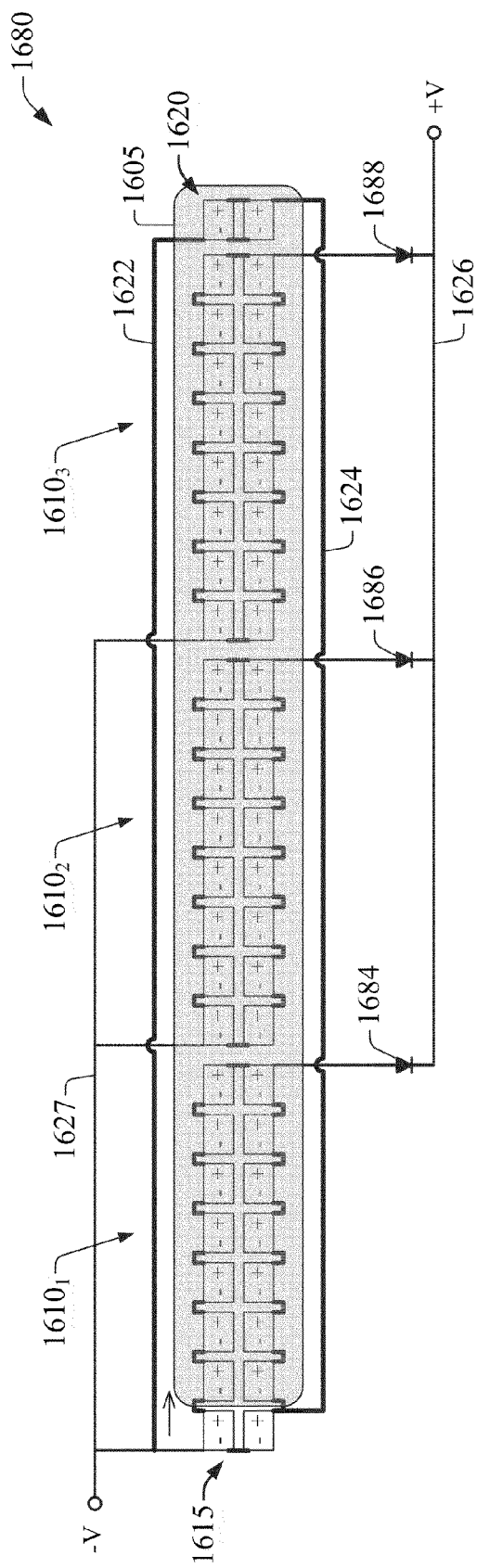
FIG. 16C displays an example configuration for collection of produced electrical current in accordance with aspects described herein.

FIGS. 16A-16B illustrate two example cluster configurations of PV cells that enable active correction of changes of focused beam light pattern in accordance with aspects described herein. Example cluster configurations 1600 and 1650 enables passive adjustment to variation(s) on focused pattern of collected sunlight, represented by shaded block 1605. In example configuration 1600, three clusters $1610_1$-$1610_3$ are illuminated by focused collected beam 1605 in an initial configuration of a solar collector, e.g., 100. Electrical output of each cluster is electrically connected to a +V (e.g., +200 V) voltage bus 1676. Likewise, wireline 1677 is a common negative voltage bus. In one or more alternative embodiments or configurations, connection to bus 1626 is accomplished through blocking diode(s); for instance, in configuration 1680 in FIG. 16C, a blocking diodes 1684, 1686, and 1688 is inserted between bus 1626 and output of modules $1610_1$, $1610_2$, and $1610_3$, respectively. Blocking diodes can prevent backflow of current of bus 1626 into a PV cluster that is non-functional or underperforming due to internal failure or lack of illumination. Each cluster includes two rows (M=2) of eight (N=8) PV elements. Upon a variation, e.g., a structural change or fault condition onset such as breaking of a reflective element, e.g., 205, focused beam 1605 can shift position onto a receiver, e.g., $120_1$; as illustrated by an open arrowhead in the drawing, focused pattern 1605 can be shifted sideways and as a result it can cease to illuminate the first pair 1615 of PV active elements, connected in parallel, in cluster $1610_1$. To prevent the ensuing open-circuit condition that can arise from lack of illumination of the first pair 1615 of PV elements, an ancillary, or redundant, pair of PV cells 1620 can be laid out neighboring PV cluster $1610_3$ and electrically connected in parallel with pair 1615; electrical connection illustrated by wires 1622 and 1624. Accordingly, illumination of ancillary pair 1620 leads to closed-circuit configuration of cluster $1610_1$ and retains its energy-conversion performance albeit displacement of focused light beam 1615.

In example configuration 1650, three clusters $1610_1$-$1610_3$ are illuminated by focused collected beam 1605 in an initial configuration of a solar collector, e.g., 100. Ancillary, or redundant, pair of cells 1670 allows to retain performance of module $1660_3$ even when a displacement (see open arrowhead) of the focused collected light beam 1605 results in the pair of PV cells 1665 being non-illuminated. As discussed above, electrical connection in parallel of ancillary pair of PV elements 1670 and cell pair 1665 leads to a closed-current loop that enables performance of PV cell cluster $1660_3$ to be substantially maintained with respect to nearly-ideal or ideal illumination conditions (see also FIGS. 13A-13C). Electrical connection among pairs 1670 and 1665 are enabled through wires 1622 and 1624. Electrical output of each cluster is electrically connected to a +V (e.g., +200 V) voltage bus 1626; in one or more alternative embodiments, connection to bus 1626 is accomplished through blocking diode(s).

In additional or alternative embodiments, a first blocking diode can be electrically connected in series between pair 1615 and the second pair of PV cells in module $1610_1$, in addition to a second blocking diode electrically connected between the output of ancillary pair 1620 and the pair of PV cells 1615. In an aspect, the first blocking diode can be diode 1684, which can be disconnected from bus 1626 and output of cluster $1610_1$ and reconnected as described. It is noted that the second blocking diode is additional to diodes 1684, 1686, and 1688. When clusters $1610_1$-$1610_3$ are normally illuminated, e.g., collected sunlight pattern 1605 covers such three clusters, the inserted first blocking diode does not affect operation of cluster 1610₁ or the entire three-cluster PV module. As described above, ancillary cells 1620 are electrically connected with pair 1615 in an OR arrangement, which prevents open-circuit condition. When PV cell pair 1615 is not illuminated due to a shift of focused light pattern 1605, the first blocking diode prevents current backflow to pair 1615 due to it underperforming or non-performing condition, while the second blocking diode allows electrical current output from ancillary pair 1620 into the PV cells that remain illuminated, and thus functional, within cluster 1610₁. A similar embodiment that includes blocking diodes in configuration 1650 can be realized. However, in such embodiment, the first diode can be embodied in diode 1688 after reconnection in series among the first (leftmost) pair of PV cells in cluster 1610₃ and the remainder of PV elements in said cluster.

It is noted that for when VMJ cells comprise clusters 1610₁-1610₃, the large reverse bias breakdown voltage associated with the VMJ cells, render unnecessary connection of bypass diodes among sub-set(s) of VMJ cells within a cluster. However, for PV elements other than VMJ cells, for example, triple-junction solar cells, such bypass diodes can be included within each PV cluster such PV elements to mitigate non-operational conditions that may result from failing PV elements.

The passive nature of the adjustment arises from the fact that PV performance is substantially retained—the extent to which energy-conversion performance is retained is dictated at least in part by energy-conversion efficiency of ancillary pair 1620 with respect to efficiency of PV elements 1615. While passive adjustment is illustrated in cluster configurations 1600, 1650, and 1680 with single ancillary pairs, larger ancillary clusters, e.g., two pairs, can be employed to accommodate shift(s) in focused light beam pattern. It is noted that larger redundant pairs also can be utilized in configurations with blocking diodes in substantially the same manner as described supra. In an aspect, a PV module consisting of a set of PV clusters utilized for energy conversion can include ancillary cells 1620 and 1670, to accommodate shifts of focused light pattern in both directions along the axis of the pattern. Moreover, ancillary or redundant PV cells can be laid out in alternative or additional positions in the vicinity of clusters 1610₁, 1610₂ or 1610₃ to passively correct operation when focused pattern 1605 shifts in alternative directions. It should be appreciated that inclusion of one or a few ancillary, or redundant, pairs of PV cells can allow retaining operation of a larger cluster of PV cells; as described, a single ancillary pair of PV elements can protect a full module of N×M elements.

Figure 17:
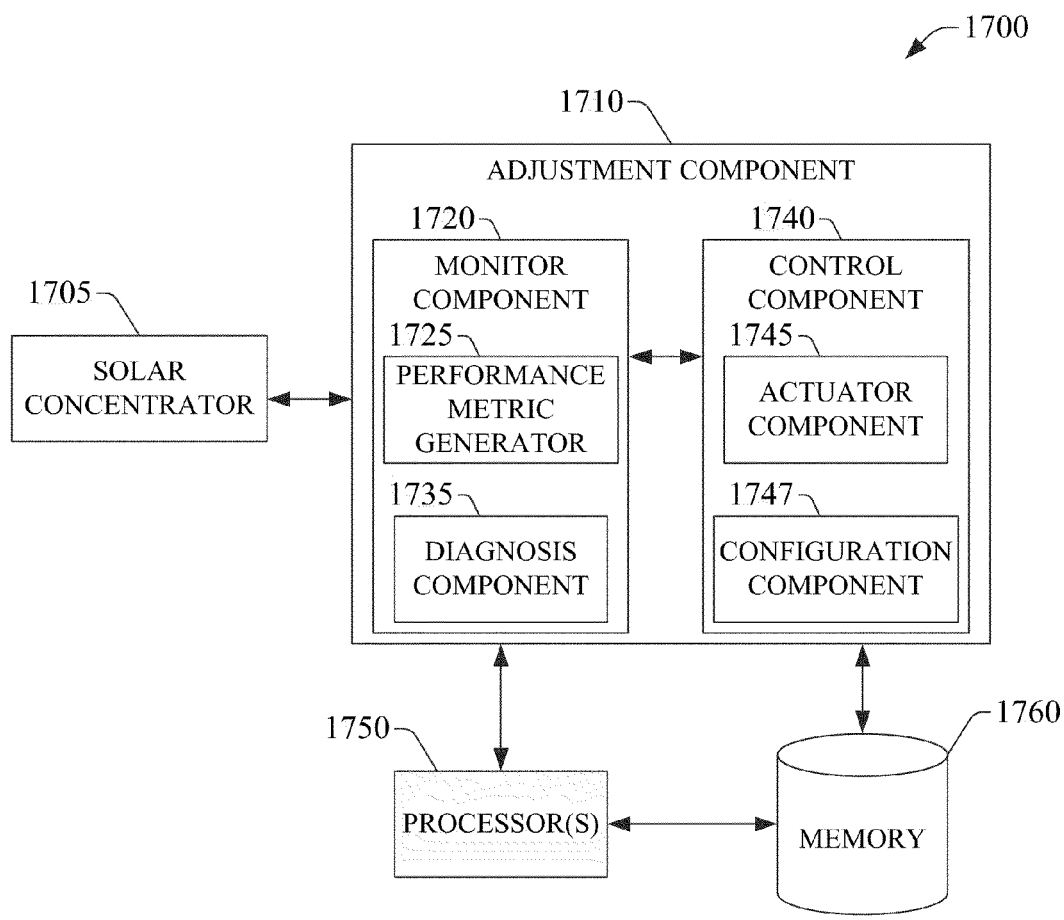
FIG. 17 is a block diagram of an example tracking system that enables adjustment of position(s) of a solar collector or reflector panel(s) thereof to maximize a performance metric of the solar collector in accordance with aspects described herein.

FIG. 17 is a block diagram of an example adjustment system 1700 that enables adjustment of position(s) of a solar collector or reflector panel(s) thereof to maximize a performance metric of the solar collector in accordance with aspects described herein. Adjustment system 1700 includes a monitor component 1720 that can supply operational data of the solar concentrator to control component 1740, which can adjust a position of the solar concentrator or one or more parts thereof in order to maximize a performance metric extracted from the operation data. Control component 1740, e.g., a computer-related entity that can be either hardware, firmware, or software, or any combination thereof, can effect the tracking or adjustment of position of the solar collector or portions thereof, e.g., one or more panels such as 130₁-130₄ or one or more reflector assemblies 135. In an aspect, such tracking comprises at least one of (i) to collect data through measurements or access to a local or remote database, (ii) to actuate motor(s) to adjust position of elements within solar concentrator, or (iii) to report condition(s) of the solar concentrator, such as energy-conversion performance metrics (e.g. output current, transferred heat . . . ), response of controlled elements, and substantially any type of diagnostics. It should be appreciated that control component 1740 can be internal or external to the adjustment component 1710, which itself can be either a centralized or distributed system, and can be embodied in a computer which can comprise a processor unit, a data and system bus architecture, and a memory storage.

Monitor component 1720 can collect data associated with performance of the solar concentrator and supply the data to a performance metric generator component 1725, also termed herein performance metric generator 1725, which can assess a performance metric based at least in part on the data. A performance metric can include at least one of energy-conversion efficiency, energy-converted current output, thermal energy production, or the like. Diagnosis component 1735 can receive generated performance metric value(s) and report a condition of the solar concentrator. In an aspect, condition(s) can be reported at various levels based at least in part on granularity of the collected operational data; for instance, for data collected at a cluster level within a PV module, diagnosis component 1735 can report condition(s) at the cluster level. Reported condition(s) can be retained in memory 1760 in order to produce historical operation data, which can be utilized to generate operational trends.

Based at least in part on generated performance metric(s), control component 1740 can drive an actuator component 1745 to adjust a position of at least one of the solar concentrator or parts thereof, such as one or more reflectors deployed within one or more panels that form the solar concentrator. Control component 1740 can drive actuator component 1745 iteratively in a closed feedback loop, in order to maximize one or more performance metrics: At each iteration of position correction effected by actuator component 1745, control component 1740 can signal monitor component 1720 to collect operation data and feed back such data in order to further drive position adjustments until a performance metric is satisfactory within a predetermined tolerance, e.g., an acceptable performance threshold. It should be appreciated that position adjustments effected by adjustment system 1700 is directed to focusing collected sunlight in the solar concentrator in a manner that it maximizes performance of the concentrator. In an aspect, as described above, for PV module(s) that include array(s) of higher-performing PV elements in a top row within a cluster, tracking system 1700 can be configured to mitigate shifts of the light-beam focused image towards the bottom area of the receiver (e.g., 120) to ensure operation remains within a high output regime.

Adjustment component 1710 also can allow automatic electrical reconfiguration of PV elements or clusters of PV elements in one or more PV modules utilized in solar concentrator 1705. To at least that end, in an aspect, monitor component 1720 can collect operational data and generate one or more performance metrics. Monitor component 1720 can convey the one or more generated performance metrics to control component 1740, which can reconfigure electrical connectivity among a plurality of PV elements of one or more clusters associated with the generated one or more performance metrics in order to maintain a desired performance of solar concentrator 1705. In aspect, electrical reconfiguration can be accomplished iteratively, through successive collection of performance data via monitor component 1720. Logic (not shown) utilized to electrically configure or reconfigure the plurality of PV elements of the one or more clusters can be retained in memory 1760. In an aspect, control component

1740 can effect the electrical configuration or reconfiguration of the plurality of PV elements through configuration component 1747, which can at least one of switch on and off various PV elements in the plurality of PV elements, or generate additional or alternative electric paths among various elements within the plurality f PV elements to attain advantageous electrical arrangements that provide or nearly provide a target performance. In one or more alternative embodiments, reconfiguration of plurality of PV elements can be implemented mechanically, through movement of the various PV elements in the plurality of PV elements. At least one advantage of automatic reconfiguration of PV module(s) in solar collector 1705 is that operational performance maintained at substantial a desired level without operator intervention; thus, adjustment component 1710 renders the solar collector 1705 self-healing.

Example system 1700 includes one or more processor(s) 1750 configured to confer, and that confer, at least in part, the described functionality of adjustment component 1710, and components therein or components associated thereto. Processor(s) 1750 can comprise various realization of computing elements like field gated programmable arrays, application specific integrated circuits, and substantially any chipset with processing capabilities, in addition to single- and multi-processor architectures, and the like. It should be appreciated that each of the one or more processor(s) 1750 can be a centralized element or a distributed element. In addition, processor(s) 1750 can be functionally coupled to adjustment component 1710 and component(s) therein, and memory 1760 through a bus, which can include at least one of a system bus, an address bus, a data bus, or a memory bus. Processor(s) 1750 can execute code instructions (not shown) stored in memory 1460, or other memory(ies), to provide the described functionality of example system 1700. Such code instructions can include program modules or software or firmware applications that implement various methods described in the subject application and associated, at least in part, with functionality of example system 1700.

In addition to code instructions or logic to effect monitoring and control, memory 1760 can retain performance metric report(s), log(s) of adjusted position of the solar concentrator, time-stamp(s) of an implemented position correction, or the like.

Figure 18A:
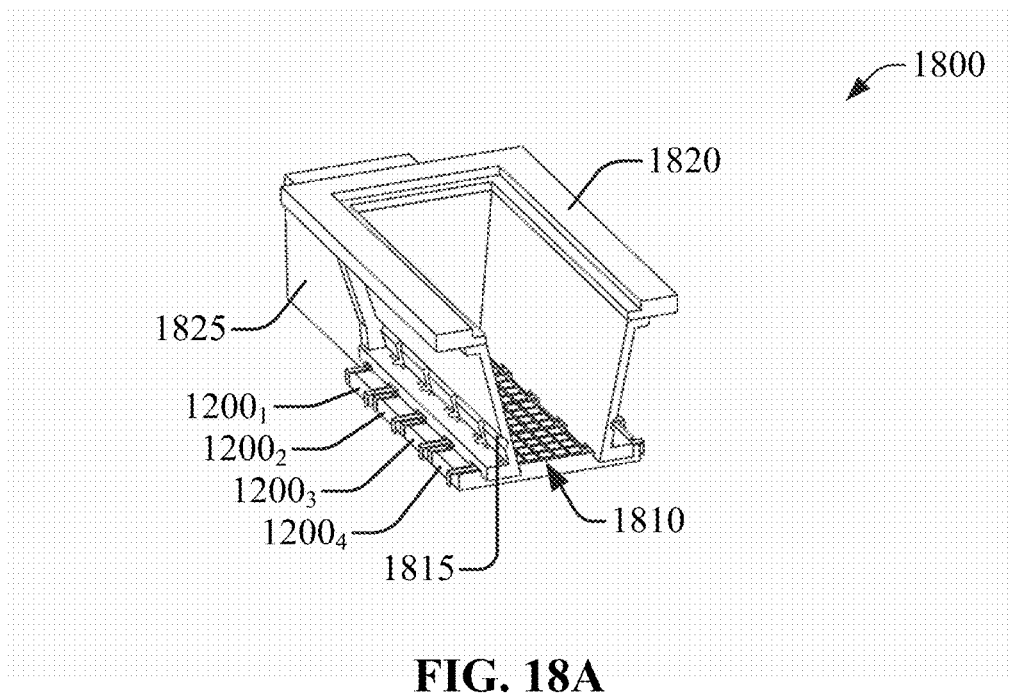
FIGS. 18A-18B represent disparate views of an embodiment of a sunlight receiver that exploits a broad collector in accordance with aspects described herein.
Figure 18B:
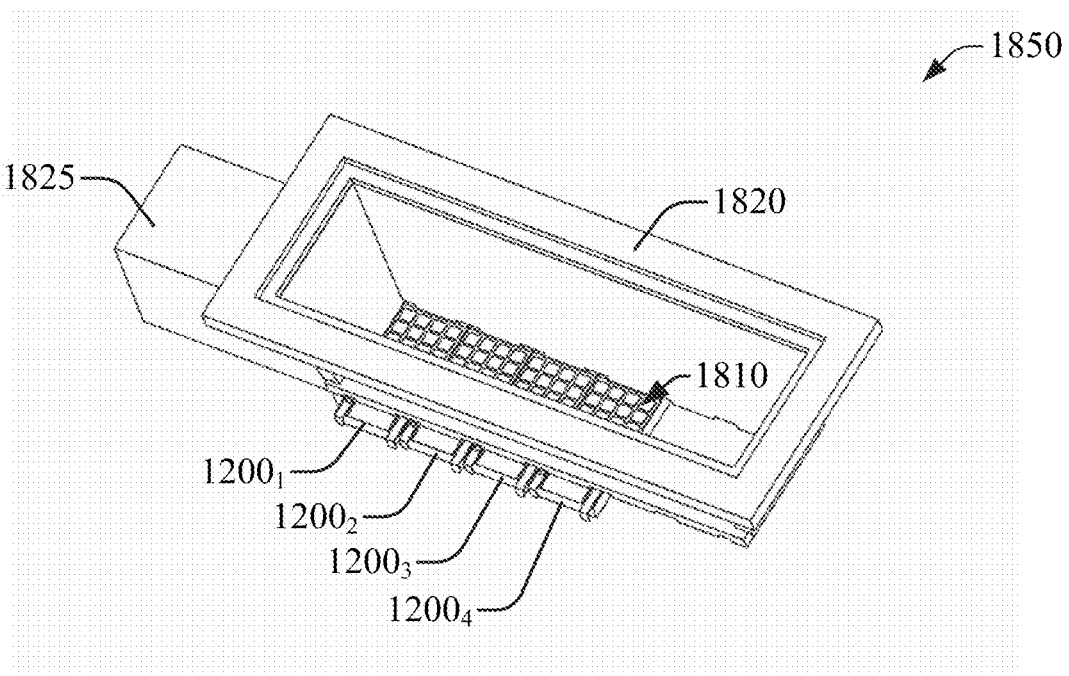

FIGS. 18A-18B represent disparate views of an embodiment of a sunlight receiver 1800 that exploits a broad collector in accordance with aspects described herein. As illustrated, the sunlight receiver 1800 includes a group of PV modules 1810, each with a set of PV clusters illustrated as squares; each set of PV clusters is bonded to a channelized collector 1240κ, with κ=1, 2, 3, 4. The channelized collectors 1200$_1$-1200$_4$ are fastened to guide 1820, which is attached to, or an integral part of, support structure 1825, which can be coupled to a support mast such as 130; while illustrated as having square section, support structure 1825 can be manufactured with disparate sections. Channelized collectors 1200$_1$-1200$_4$ can extract heat from the group of PV modules 1810. In addition, the sunlight receiver 1800 includes an open collection guide 1820, also referred to as guide 1820, with a gradually-opening side section (FIG. 18A) and a rectangular top section (FIG. 18B); the guide 1820 can be fabricated of metal, ceramics or coated ceramics, or cast materials, or substantially any solid material that is highly reflective in the visible spectrum of electromagnetic radiation. It is noted that external surface of guide 1820 can be coated with a thermoelectric material for energy conversion as a byproduct of heating of the guide that results from incident sunlight. As described above, electricity produced thermoelectrically can supplement electricity production of PV module 1810. In addition, guide 1820 can include one or more conduits 1815, typically internal to the wall(s) of or embedded within guide 1820, that can allow circulation of a fluid for thermal harvesting; circulating fluid can be at least a portion of fluid that circulates through channelized heat collectors 1200κ.

An advantage of the broad-collector receiver is that light incident in the inner walls of the broad guide 1820 is reflected and scattered in multiple instances, and thus produces a uniformization of the light incident in the group of PV modules 1810. It is noted that sunlight directly impinges in the PV module 1810, or can be reflected and scattered at the interior of guide 1820 and recollected after one or more successive scattering events. The angle formed among the major sides of guide 1820 and the platform formed by channelized collectors 1200$_1$-1200$_4$ can dictate, at least in part, a degree of uniformity of resulting light incident in PV module 1810.

Figure 19:
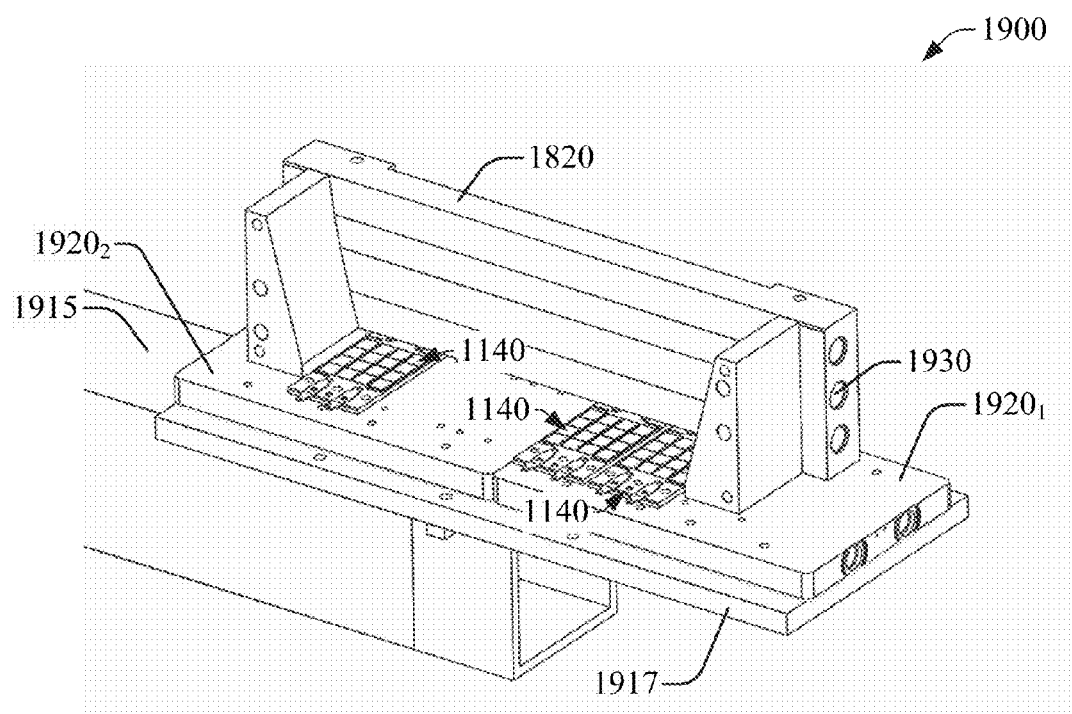
FIG. 19 displays an example alternative or additional embodiment of a sunlight receiver that exploits a broad collector in accordance with aspects described herein.

FIG. 19 displays an example alternative embodiment of a solar receiver 1900 that exploits a broad collector in accordance with aspects described herein. Guide 1820 (shown in a section view) is attached to a set of two heat collectors or heat transfer elements 1920$_1$ and 1920$_2$; each of the heat collectors include a channelized structure substantially the same as 1210, and thus operate in substantially the same manner as channelized heat collector 1200. As described above, guide 1820 includes conduit(s) 1930 that allow circulation of fluid for cooling of the guide or heat collection. Likewise, heat collectors 1920$_1$ and 1920$_2$ have conduit(s) 1940 that allows passage of cooling fluid(s), which further enable refrigeration and heat harvesting. Heat transfer elements 1920$_1$ and 1920$_2$ are fastened to a supporting plate 1917 that is an integral part of support structure 1915. While two heat collectors 1920$_1$ and 1920$_2$ are illustrated, additional heat collectors can be present in the broad collector 1900, as allowed by the size of supporting plate 1917. Bolted or fastened to heat collectors 1910$_1$ and 1920$_1$ are a set of three PV modules 1140. It should be appreciated that each of the PV modules are in thermal contact with the heat collectors; however, are not bonded onto the heat collectors but rather fastened thereto through fastening means include in the PV modules (see FIG. 11). Moreover, additional PV modules 1140 can be deployed as permitted by space constraints imposed by size of each of the heat collectors. As described above, broad collector or receiver 1900 allows light to be nearly uniformly distributed onto PV modules 1400 and enables harvesting of thermal energy. In addition, each of the laid out PV modules 1400 can be serviced or replaced independently, with ensuing reduction in operational cost(s) and maintenance.

Figure 20:
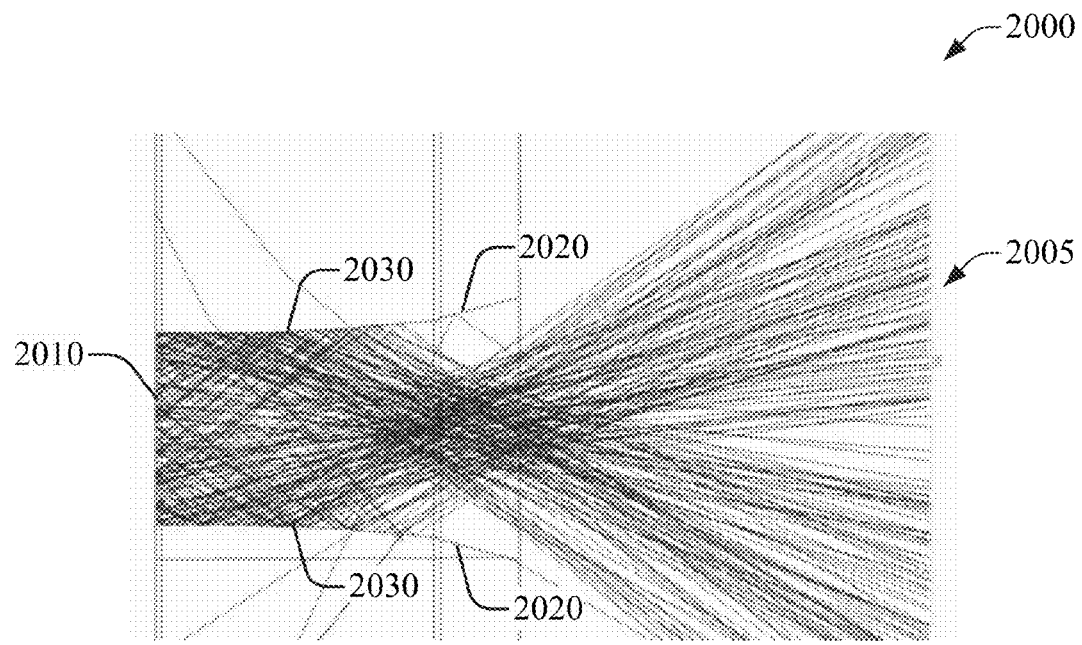
FIG. 20 illustrates a ray-tracing simulation of light incidence onto the surface of a PV module that result from multiple reflections on the inner surface of a reflective guide in a broad-collector receiver.
Figure 21:
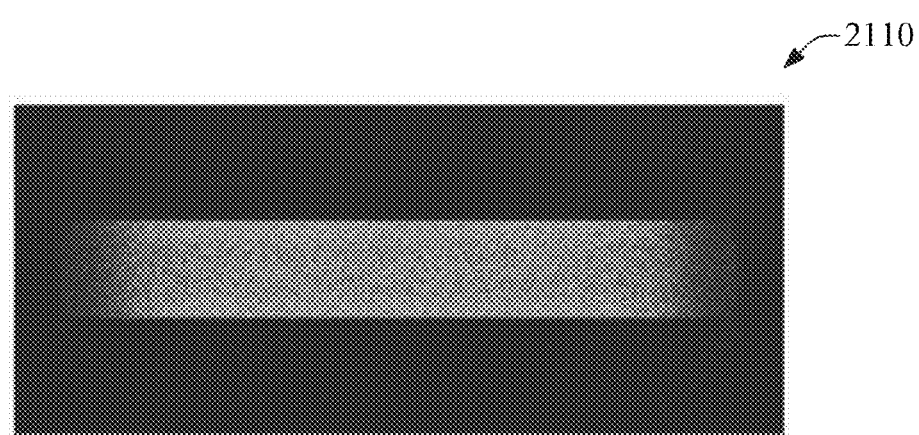
FIG. 21 presents a simulated image of light collected at a PV module in a broad-collector receiver with a reflective guide attached thereof.

FIG. 20 illustrates a ray-tracing simulation 2000 of light incidence onto the surface of PV module 1810 that results from multiple reflections on the inner surface of guide 1820. In the simulation, light rays 2005 (rendered as dense lines) randomly oriented within a predetermined angular range is directed towards the broad collector, shown as contours 2030 and 2020, and can reach the PV module, modeled as region 2010. Collection of incidence events, e.g., accumulation of rays that reach the surface of the PV module in the model, illustrated as region 2010, enables generation of a simulated detector profile that reveal, at least semi-quantitatively. FIG. 21 presents a simulated image 2110 of light collected at PV module 1810 in a broad-collector receiver with guide 2020. The simulated image of collected light reveals that multiple reflections at the inner walls of guide 1820 provide a substantially uniform light collection, which can reduce complexity of clusters of PV cells in PV module 1810.

Figure 22:
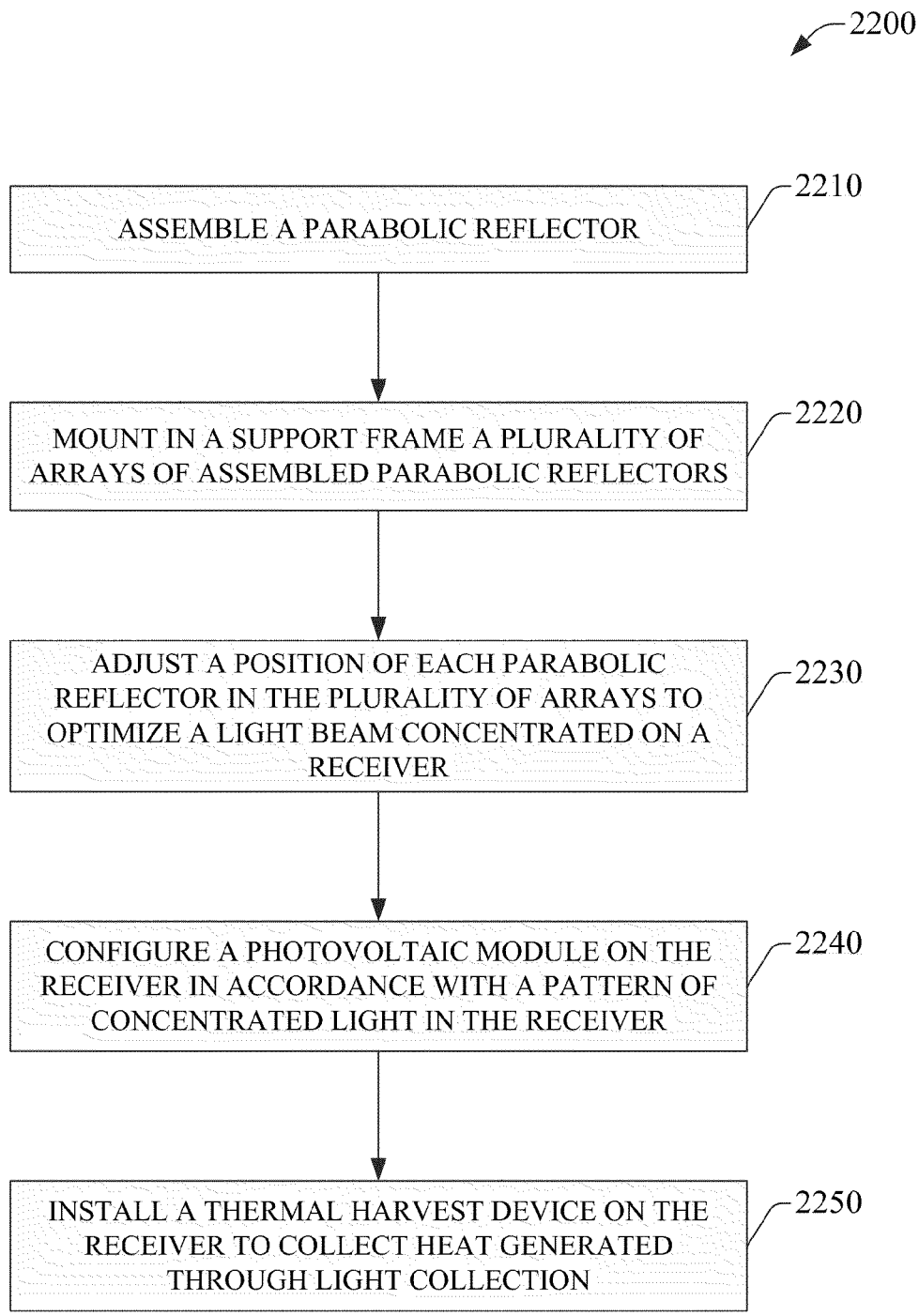
FIG. 22 presents a flowchart of an example method for utilizing parabolic reflectors to concentrate light for energy conversion in accordance with aspects described herein.
Figure 23:
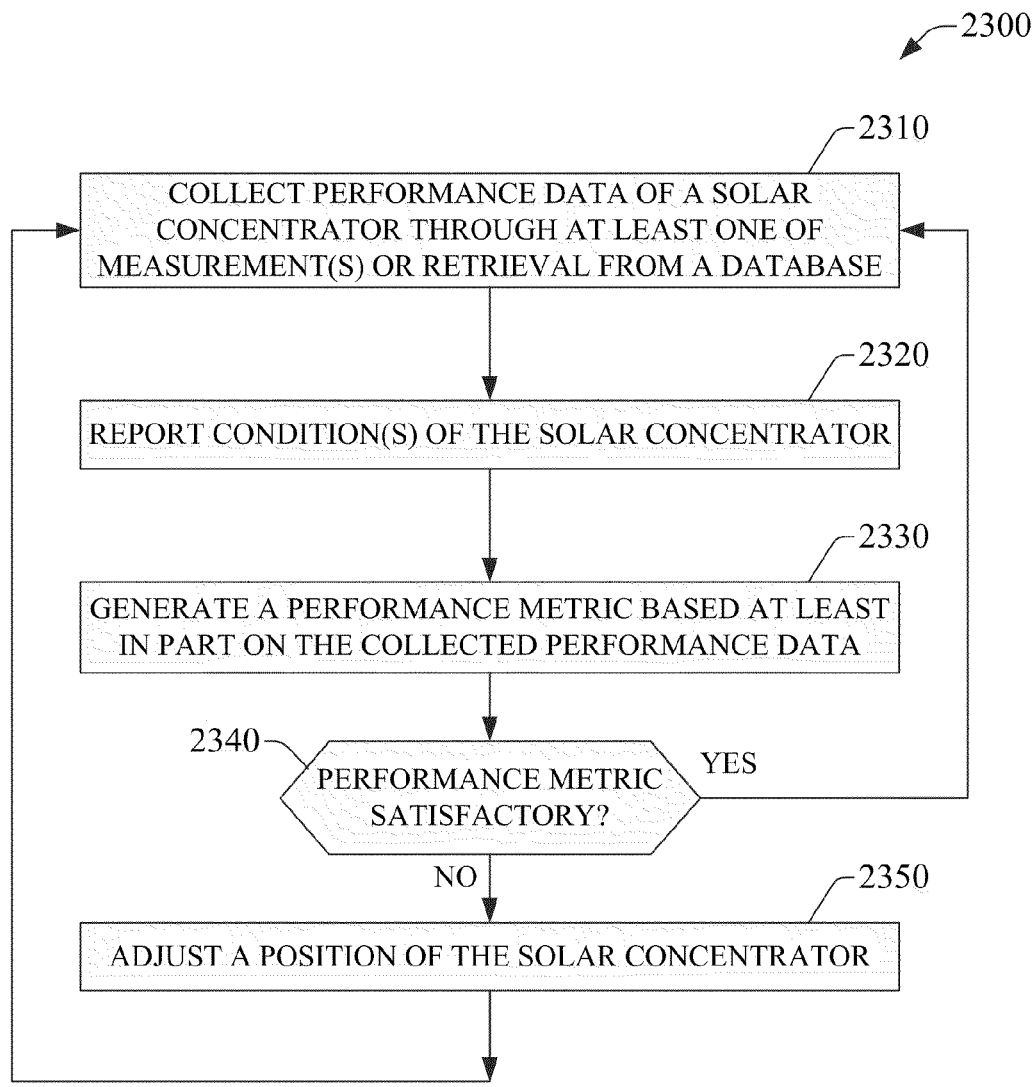
FIG. 23 is a flowchart of an example method to adjust a position of a solar concentrator to achieve a predetermined performance in accordance with aspects described herein.

In view of the example systems and elements described above, an example method that can be implemented in accordance with the disclosed subject matter can be better appreciated with reference to flowcharts in FIGS. 22-23. For purposes of simplicity of explanation, example methods are presented and described as a series of acts; however, it is to be understood and appreciated that the described and claimed subject matter is not limited by the order of acts, as some acts may occur in different orders and/or concurrently with other acts from that shown and described herein. For example, it is to be understood and appreciated that a method can alternatively be represented as a series of interrelated states or events, such as in a state diagram or interaction diagram. Moreover, not all illustrated acts may be required to implement example method in accordance with the subject specification. Additionally, it should be further appreciated that the method(s) disclosed hereinafter and throughout this specification are capable of being stored on an article of manufacture, or computer-readable medium, to facilitate transporting and transferring such method(s) to computers for execution, and thus implementation, by a processor or for storage in a memory.

In particular, FIG. 22 presents a flowchart of an example method 2200 for utilizing parabolic reflectors to concentrate light for energy conversion. At act 2210 a parabolic reflector is assembled. Assembly includes bending an originally flat reflective element (e.g., a thin glass mirror) into a parabolic section, or a trough shape, through support ribs of varying size attached to a support beam. In an aspect, the initially flat reflective material is rectangular in shape and the support beam in oriented along the major axis of the rectangle. Various materials and attachment means, including an integrated option for support ribs and beam, can be employed for mass producing or assembling the parabolic reflector.

At act 2220 a plurality of arrays of assembled parabolic reflectors is mounted in a support frame. The number of assembled parabolic reflectors that are included in each of the arrays depends at least in part on a desired size of a sunlight collection area, which can be determined primarily by the utility intended for the collected light. In addition, size of the arrays is also affected, at least in part, by a desired uniformity of a light beam pattern collected on a focal locus in a receiver. Increased uniformity is typically attained with smaller array sizes. In an aspect of the subject innovation parabolic reflectors are position at the same focal distance from the receiver in order to increase uniformity of the collected light pattern.

At act 2230 a position of each reflector in the plurality of arrays is adjusted to optimize a light beam concentrated on a receiver. The adjustment can be implemented at a time of deployment of a solar concentrator or upon utilization in a test phase or in production mode. In addition adjustment can be performed while operating the solar concentrator based at least in part on measured operation data and related performance metrics generated from the data. Adjustment typically aims at attaining a uniform collected light pattern on the receiver, which includes a PV module for energy conversion. In addition to uniformity, the light pattern is adjusted for focusing substantially completely onto the PV active elements (e.g., solar cells in the PV module) to increase the performance of the module. The adjustment can be performed automatically via a tracking system installed in, or functionally coupled to, the solar collector. Such an automated system can increase complexity of the receiver because circuitry associated with a control component and related measurement devices is to be installed in the receiver in order to implement the tracking or optimization. Yet, costs associated with the increased complexity can be offset by increased performance of the PV module as a result of retaining an optimal sunlight concentration configuration for the reflectors within the array(s).

At act 2240 a photovoltaic module is configured on the receiver in accordance with a pattern of concentrated light in the receiver. In an aspect of the subject innovation, even an optimal configuration of mounted parabolic reflectors can results in a non-uniform shape of a light beam pattern focused on the receiver due to at least one of imperfections on reflective surface(s) of the reflectors, torsional distortion of reflective surface(s) and associated distortion of pattern of reflected light, accumulation of stains on reflective surface(s), or the like Accordingly, PV cells such as VMJs, thin-film tandem solar cells, triple-junction solar cells, or nanostructured solar cells in the PV module can be arranged in clusters of disparate shapes, or units, (FIG. 15A-15C) so as to increase exposure to collected light and thus increase energy conversion performance. In addition, configuring the PV module can include laying out ancillary PV elements (e.g., 1620 or 1670) to passively correct shifts or distortions of a pattern of collected light.

At act 2250 a thermal harvesting device is installed on the receiver to collect heat generated through light collection. In an aspect of the subject innovation, the thermal harvest device can be at least one of a metal serpentine or a channelized collector that circulates a fluid to collect and transport heat. In another aspect the thermal energy harvest device can be a thermoelectric device the converts heat into electricity to supplement photovoltaic energy conversion.

FIG. 23 is a flowchart of an example method 2300 to adjust a position of a solar concentrator to achieve a predetermined performance in accordance with aspects described herein. The subject example method 2300 can be implemented by a adjustment component, e.g., 1710, or a processor therein or functionally coupled thereto. While illustrated for a solar concentrator, example method 2300 can be implemented for adjusting a position of one or more parabolic reflectors. At act 2310, performance data of a solar concentrator is collected through at least one of measurement(s) or retrieval from a database, which includes current and historical operational data. At act 2320, condition(s) of the solar concentrator are reported. At act 2330, a performance metric based at least in part on the collected performance data is generated. A performance metric can include at least one of energy-conversion efficiency, energy-converted current output, thermal energy production, or the like. In addition, performance metric can be generated for a set of clusters of PV elements in a PV module, for a single cluster, or for a set of one or more constituent PV elements within a cluster. At act 2340 it is evaluated if the performance metric is satisfactory. In an aspect, such evaluation can be based on a set of one or more predefined thresholds for the performance metric, with satisfactory performance metric defined as performance above one or more thresholds; the set of one or more thresholds can be established by an operator that administers the solar concentrator.

When the outcome of evaluation act 2340 indicates that performance metric is satisfactory, flow is directed to act 2310 for further performance data collection. In an aspect, flow can be redirected to act 2310 after a predetermined waiting period, e.g., an hour, 12 hours, a day, elapses. In another aspect, prior to directing flow to act 2310, a message can be conveyed to an operator, e.g., via a terminal or computer, querying whether further performance data collection is desired. When outcome of evaluation act 2340 reveals performance metric is not satisfactory, or below one or more thresholds, a position of the solar concentrator is adjusted at act 2350 and flow is redirected to act 2310 for further data collection.

Figure 24:
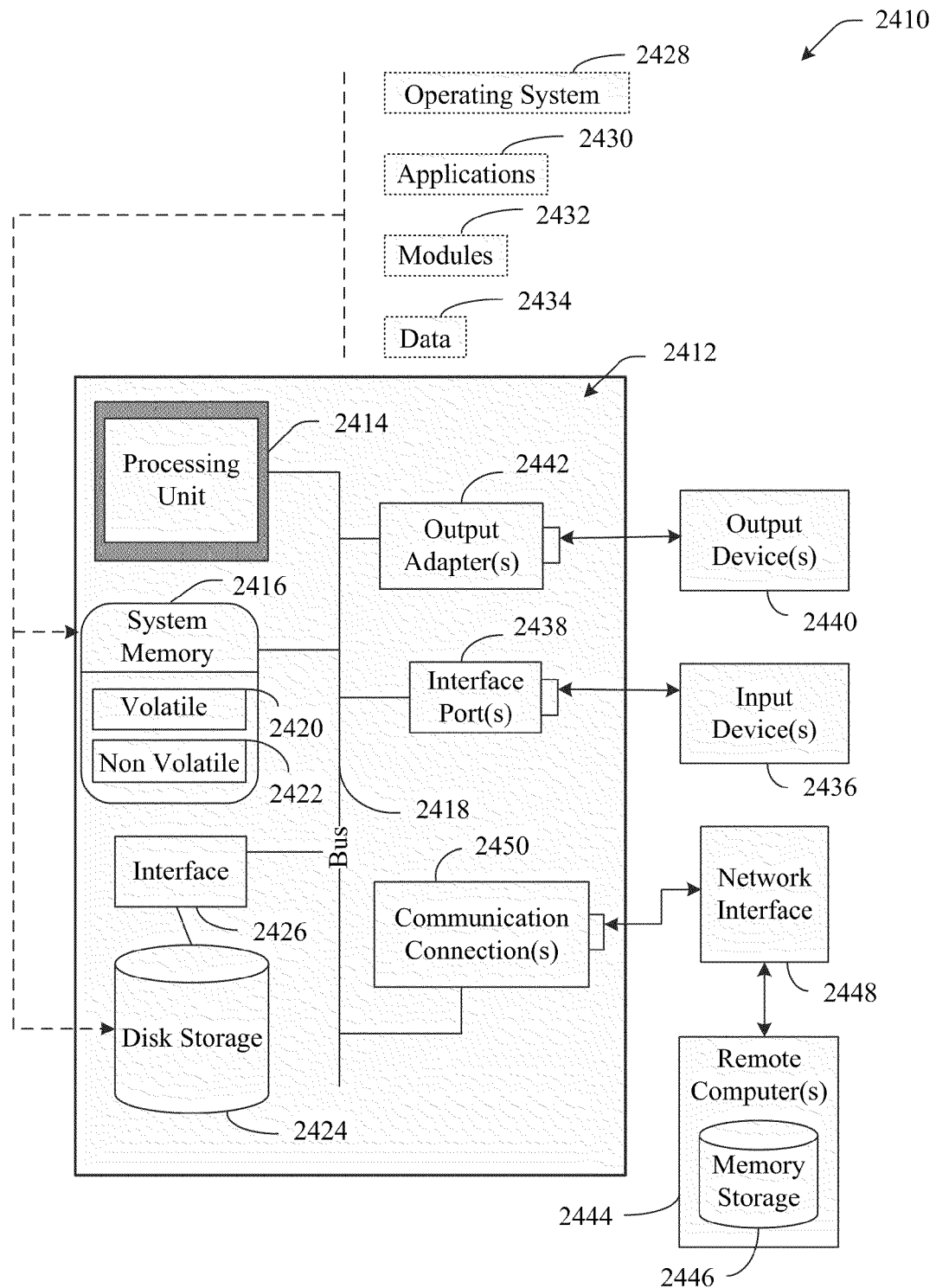
FIG. 24 is an example functional environment that enables various aspects of adjustment component and component(s) therein as described in the subject innovation.

With reference to FIG. 24, an example environment 2410 for implementing various aspects of adjustment component and component(s) therein is described that includes a computer 2412. The computer 2412 includes a processing unit 2414, a system memory 2416, and a system bus 2418. The system bus 2418 couples system components including, but not limited to, the system memory 2416 to the processing unit 2414. The processing unit 2414 can be any of various available processors. Dual microprocessors and other multiprocessor architectures also can be employed as the processing unit 2414.

The system bus 2418 can be any of several types of bus structure(s) including the memory bus or memory controller, a peripheral bus or external bus, and/or a local bus using any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCM-CIA), and Small Computer Systems Interface (SCSI).

The system memory 2416 includes volatile memory 2420 and nonvolatile memory 2422. The basic input/output system (BIOS), containing the basic routines to transfer information between elements within the computer 2412, such as during start-up, is stored in nonvolatile memory 2422. By way of illustration, and not limitation, nonvolatile memory 2422 can include read only memory (ROM), programmable ROM (PROM), electrically programmable ROM (EPROM), electrically erasable ROM (EEPROM), or flash memory. Volatile memory 2420 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 2412 also includes removable/non-removable, volatile/nonvolatile computer storage media. FIG. 24 illustrates a disk storage 2424, wherein such disk storage 2424 includes, but is not limited to, devices like a magnetic disk drive, floppy disk drive, tape drive, Jaz drive, Zip drive, LS-60 drive, flash memory card, or memory stick. In addition, disk storage 2424 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 2424 to the system bus 2418, a removable or non-removable interface is typically used such as interface 2426.

It is to be appreciated that FIG. 24 describes software that acts as an intermediary between users and the basic computer resources described in suitable operating environment 2410. Such software includes an operating system 2428. Operating system 2428, which can be stored on disk storage 2424, acts to control and allocate resources of the computer system 2412. System applications 2430 take advantage of the management of resources by operating system 2428 through program modules 2432 and program data 2434 stored either in system memory 2416 or on disk storage 2424. It is to be appreciated that various components described herein can be implemented with various operating systems or combinations of operating systems.

A user enters commands or information into the computer 2412 through input device(s) 2436. Input devices 2436 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 2414 through the system bus 2418 via interface port(s) 2438. Interface port(s) 2438 include, for example, a serial port, a parallel port, a game port, and a universal serial bus (USB). Output device(s) 2440 use some of the same type of ports as input device(s) 2436. Thus, for example, a USB port may be used to provide input to computer 2412, and to output information from computer 2412 to an output device 2440. Output adapter 2442 is provided to illustrate that there are some output devices 2440 like monitors, speakers, and printers, among other output devices 2440 that require special adapters. The output adapters 2442 include, by way of illustration and not limitation, video and sound cards that provide a means of connection between the output device 2440 and the system bus 2418. It should be noted that other devices and/or systems of devices provide both input and output capabilities such as remote computer(s) 2444.

Computer 2412 can operate in a networked environment using logical connections to one or more remote computers, such as remote computer(s) 2444. The remote computer(s) 2444 can be a personal computer, a server, a router, a network PC, a workstation, a microprocessor based appliance, a peer device or other common network node and the like, and typically includes many or all of the elements described relative to computer 2412. For purposes of brevity, only a memory storage device 2446 is illustrated with remote computer(s) 2444. Remote computer(s) 2444 is logically connected to computer 2412 through a network interface 2448 and then physically connected via communication connection 2450. Network interface 2448 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 2450 refers to the hardware/software employed to connect the network interface 2448 to the bus 2418. While communication connection 2450 is shown for illustrative clarity inside computer 2412, it can also be external to computer 2412. The hardware/software necessary for connection to the network interface 2448 includes, for exemplary purposes only, internal and external technologies such as, modems including regular telephone grade modems, cable modems and DSL modems, ISDN adapters, and Ethernet cards.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nanoscale architectures such as, but not limited to, molecular and quantum-dot based transistors, switches and gates, in order to optimize space usage or enhance performance of user equipment. A processor may also be implemented as a combination of computing processing units.

In the subject specification, terms such as "store," "data store," data storage," "database," and substantially any other information storage component relevant to operation and functionality of a component, refer to "memory components," or entities embodied in a "memory" or components comprising the memory. It will be appreciated that the memory components described herein can be either volatile memory or nonvolatile memory, or can include both volatile and nonvolatile memory.

By way of illustration, and not limitation, nonvolatile memory can include read only memory (ROM), programmable ROM (PROM), electrically programmable ROM (EPROM), electrically erasable ROM (EEPROM), or flash memory. Volatile memory can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

Various aspects or features described herein can be implemented as a method, apparatus, or article of manufacture using standard programming and/or engineering techniques. In addition, various aspects disclosed in the subject specification can also be implemented through program modules stored in a memory and executed by a processor, or other combination of hardware and software, or hardware and firmware. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical discs (e.g., compact disc (CD), digital versatile disc (DVD), blu-ray disc (BD) . . . ), smart cards, and flash memory devices (e.g., card, stick, key drive . . . ).

In particular and in regard to the various functions performed by the above described components, devices, circuits, systems, and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated example aspects. In this regard, it will also be recognized that the various aspects include a system as well as a computer-readable medium having computer-executable instructions for performing the acts and/or events of the various methods.

What has been described above includes examples of systems and methods that provide advantages of the subject innovation. It is, of course, not possible to describe every conceivable combination of components or methods for purposes of describing the subject innovation, but one of ordinary skill in the art may recognize that many further combinations and permutations of the claimed subject matter are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A solar concentrator comprising:
at least one receiver configured to receive light from at least one reflector, the at least one receiver comprising a plurality of photovoltaic (PV) modules having a modular configuration, wherein each PV module in the plurality of PV modules comprising:
a heat collector, comprising a front surface and a back surface, further comprising:
a cluster of PV cells located on the front surface; and
a cavity located on the back surface opposite to the location of PV cells located on the front surface and connected to a coolant inlet and a coolant outlet, wherein the cavity comprising a surface with a plurality of channels aligned to facilitate flow of coolant between the coolant inlet and the coolant outlet, the back surface of the heat collector is configured to be located against a planar surface configured to cover the back surface of the heat collector thereby forming a chamber with the cavity through which coolant flows from the coolant inlet and the coolant outlet;
wherein the plurality of PV modules are combined to form the receiver, with the coolant passing therebetween the plurality of PV modules, the coolant inlet opens onto the front surface and on a first side of the cluster of PV cells and the coolant outlet opens on the front surface and on a second side of the cluster of PV cells, the coolant inlet, coolant outlet and cluster of PV cells are located coplanar on the front surface, the first side and second side of the cluster of PV cells are diametrically opposed, the coolant inlet and coolant outlet connect to the back surface cavity.

2. The solar concentrator of claim 1, wherein the clusters of PV cells are arranged to optimally utilize the received light, each PV cell in the cluster of PV cells comprises at least one of a crystalline silicon solar cell, a crystalline germanium solar cell, a solar cell based on the III-V semiconductor group, a CuGaSe-based solar cell, a CuInSe-based solar cell, an amorphous silicon cell, a thin-film tandem solar cell, a triple-junction solar cell, or a nanostructured solar cell.

3. The solar concentrator of claim 2, wherein each PV cell in the cluster of PV cells is monolithic and oriented along a specific axis normal to a plane that contains the PV module.

4. The solar concentrator of claim 2, wherein each cluster of PV cells comprises at least one row of a plurality of PV cells electrically coupled in a series connection.

5. The solar concentrator of claim 4, wherein the at least one row of the plurality of PV cells comprises current-matched PV active elements, wherein the PV active elements are current matched based at least in part on a performance characterization conducted in a testing facility under simulated operating field conditions.

6. The solar concentrator of claim 1, wherein the coolant is associated with a thermal energy harvest system.

7. The solar concentrator of claim 6, wherein the thermal energy harvest system comprises a thermoelectric device configured to convert heat energy conveyed by the coolant into electricity energy.

8. The solar concentrator of claim 1, wherein the at least one receiver includes a casing configured to reflect light received from the at least one reflector towards the at least one receiver.

9. The solar concentrator of claim 8, wherein the casing comprises a plurality of nozzles to facilitate exhaustion of hot air from a vicinity of the PV module to increase energy conversion performance.

10. A photovoltaic receiver, comprising:
a plurality of photovoltaic (PV) modules having a modular configuration, wherein each PV module in the plurality of PV modules comprising:
a solid platform comprising a first flat surface and a second side diametrically opposed to the first flat surface, further comprising:
a set of electrically and mutually coupled PV elements, the set of PV elements fixated on the first flat surface of the solid platform; wherein the set of PV elements are arranged in at least one cluster of PV elements configured to maximize exposure to sunlight incident in the PV module, the PV elements include at least one of crystalline semiconductor-based solar cells, amorphous silicon cells, thin-film tandem solar cell, or nanostructured solar cells; and
a cavity located on the second side connected to a coolant inlet and a coolant outlet, wherein the cavity comprising a surface with a plurality of channels aligned to facilitate flow of coolant between the coolant inlet and the coolant outlet, the second side of the heat collector is configured to be located against a planar surface configured to cover the second side of the heat collector thereby forming a chamber with the cavity through which coolant flows from the coolant inlet and the coolant outlet, the coolant inlet opens onto the front surface and on a first side of the cluster of PV elements and the coolant outlet opens on the front surface and on a second side of the cluster of PV elements, the coolant inlet opening, coolant outlet opening and cluster of PV elements are located coplanar on the front surface, the first side and second side of the cluster of PV elements are diametrically opposed, the coolant inlet and coolant outlet connect to the back surface cavity.

11. The photovoltaic receiver of claim 10, wherein each PV module is removably attached to the planar surface configured to cover the second side of the heat collector.

12. The photovoltaic receiver of claim 10, wherein the solid platform is part of the PV module configured to refrigerate the set of PV elements.

13. The photovoltaic receiver of claim 10, further comprising a reflective light collection guide configured to facilitate uniformization of light collected at the set of PV elements.

14. The photovoltaic receiver of claim 10, wherein the PV module is coated with a thermoelectric material to supplement energy conversion generated through the photovoltaic receiver.

15. The solar concentrator of claim 1, wherein upon failure of any PV cell in the cluster of PV cells comprising a first PV module in the plurality of PV modules, the first PV module is replaced with a second PV module having the modular configuration of the first PV module.

16. The solar concentrator of claim 1, wherein the plurality of channels are aligned parallel with a direction between the coolant inlet and the coolant outlet.

17. The solar concentrator of claim 1, further comprising a light guide configured to facilitate reflection of light incident on the light guide surface onto the cluster of PV cells, wherein the light guide further comprises at least one conduit attached to at least one of the coolant inlet or the coolant outlet to facilitate circulation of the coolant between the heat collector and the light guide.

18. The solar concentrator of claim 17, wherein a bottom surface of the light guide is configured to locate against the front surface of the heat collector, the bottom surface comprising a conduit of the at least one conduit, and an opening of the conduit located on the bottom surface aligned to open on the coolant inlet or coolant outlet.

* * * * *